(12) United States Patent
Bito et al.

(10) Patent No.: US 7,868,614 B2
(45) Date of Patent: Jan. 11, 2011

(54) MAGNETIC RESONANCE SYSTEM AND METHOD

(75) Inventors: Yoshitaka Bito, Kokubunji (JP); Hisaaki Ochi, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/623,418

(22) Filed: Jan. 16, 2007

(65) Prior Publication Data

US 2007/0164742 A1 Jul. 19, 2007

(30) Foreign Application Priority Data

Jan. 16, 2006 (JP) .............................. 2006-007318

(51) Int. Cl.
*G01V 3/00* (2006.01)

(52) U.S. Cl. ...................................... 324/307

(58) Field of Classification Search .......... 324/300–322
See application file for complete search history.

(56) References Cited

U.S. PATENT DOCUMENTS

| 4,975,644 | A | * | 12/1990 | Fox | ............................... | 324/318 |
|---|---|---|---|---|---|---|
| 5,374,890 | A | * | 12/1994 | Zou et al. | .................... | 324/318 |
| 5,808,467 | A | * | 9/1998 | Ochi et al. | .................... | 324/309 |
| 5,928,148 | A | * | 7/1999 | Wang et al. | .................. | 600/420 |
| 6,323,648 | B1 | * | 11/2001 | Belt et al. | .................... | 324/322 |
| 6,366,092 | B1 | * | 4/2002 | Ehnholm et al. | ............ | 324/309 |
| 6,377,044 | B1 | * | 4/2002 | Burl et al. | .................... | 324/307 |
| 6,590,392 | B2 | * | 7/2003 | Boskamp et al. | ............ | 324/318 |
| 6,593,744 | B2 | * | 7/2003 | Burl et al. | .................... | 324/322 |
| 6,624,633 | B1 | * | 9/2003 | Zou et al. | .................... | 324/318 |
| 6,677,755 | B2 | * | 1/2004 | Belt et al. | .................... | 324/322 |
| 6,714,012 | B2 | * | 3/2004 | Belt et al. | .................... | 324/318 |
| 6,737,866 | B2 | * | 5/2004 | Belt et al. | .................... | 324/318 |
| 6,747,454 | B2 | * | 6/2004 | Belt | ......................... | 324/318 |
| 6,888,351 | B2 | * | 5/2005 | Belt et al. | .................... | 324/318 |

(Continued)

FOREIGN PATENT DOCUMENTS

JP 07-000370 1/1995

(Continued)

OTHER PUBLICATIONS

McDougall MP, Wright SM, 64-channel array coil for single echo acquisition magnetic resonance imaging, Magnetic Resonance in Medicine, 2005, No. 54, pp. 386-392.

*Primary Examiner*—Melissa J Koval
*Assistant Examiner*—Dixomara Vargas
(74) *Attorney, Agent, or Firm*—Antonelli, Terry, Stout & Kraus, LLP.

(57) ABSTRACT

The invention provides a magnetic resonance system and method of measuring continuous regions at high speed without decreasing SN. As a receive system, multiple RF coil sets a, b comprising multiple RF coils a1, a2, b1, b2 are disposed in positions where there is no spatial interference with at least one of the RF coils of an adjacent coil set, the RF coils constituting each coil set are changed over one by one, sets of RF coils which do not interfere mutually are activated, and signals are simultaneously acquired from a number of regions equivalent to the number n of coil sets. Hence, if the number of coil sets is set to n, the measurement time can be shortened to 1/n. Alternatively, the SN can be improved by $\sqrt{n}$ times.

19 Claims, 20 Drawing Sheets

U.S. PATENT DOCUMENTS

| | | |
|---|---|---|
| 6,897,658 B2 * | 5/2005 | Belt et al. .................. 324/322 |
| 6,946,836 B2 * | 9/2005 | Kuhara ....................... 324/307 |
| 7,026,818 B2 * | 4/2006 | Machida et al. ............ 324/322 |
| 7,141,980 B2 * | 11/2006 | Belt et al. .................. 324/322 |
| 7,176,689 B2 * | 2/2007 | Machida et al. ............ 324/318 |
| 7,180,291 B2 * | 2/2007 | Chmielewski et al. ...... 324/318 |
| 7,190,164 B2 * | 3/2007 | Kuhara ....................... 324/309 |
| 7,235,973 B2 * | 6/2007 | Chmielewski et al. ...... 324/318 |

FOREIGN PATENT DOCUMENTS

| | | |
|---|---|---|
| JP | 09-262219 | 10/1997 |
| JP | 11-206735 | 8/1999 |
| JP | 2002-153440 | 5/2002 |
| JP | 2004-201756 | 7/2004 |
| JP | 2005-152655 | 6/2005 |
| JP | 2005-152657 | 6/2005 |

* cited by examiner

FIG. 6
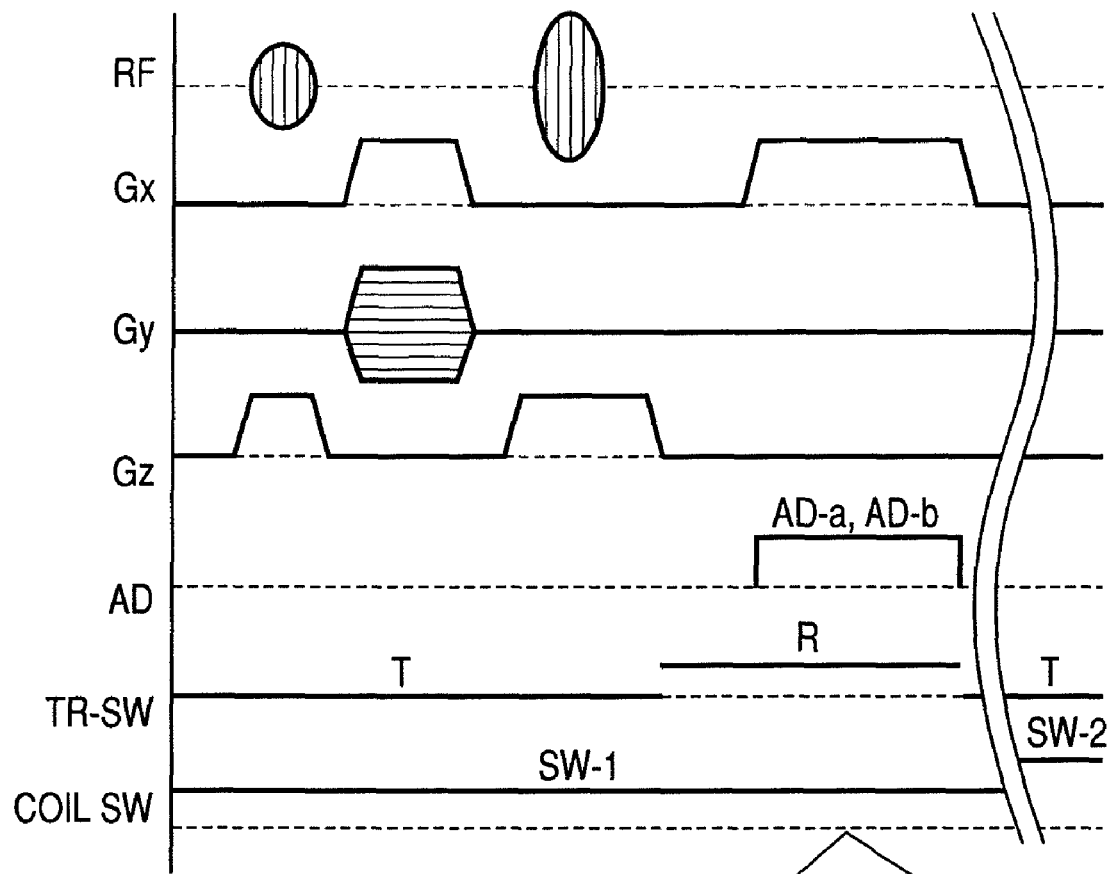
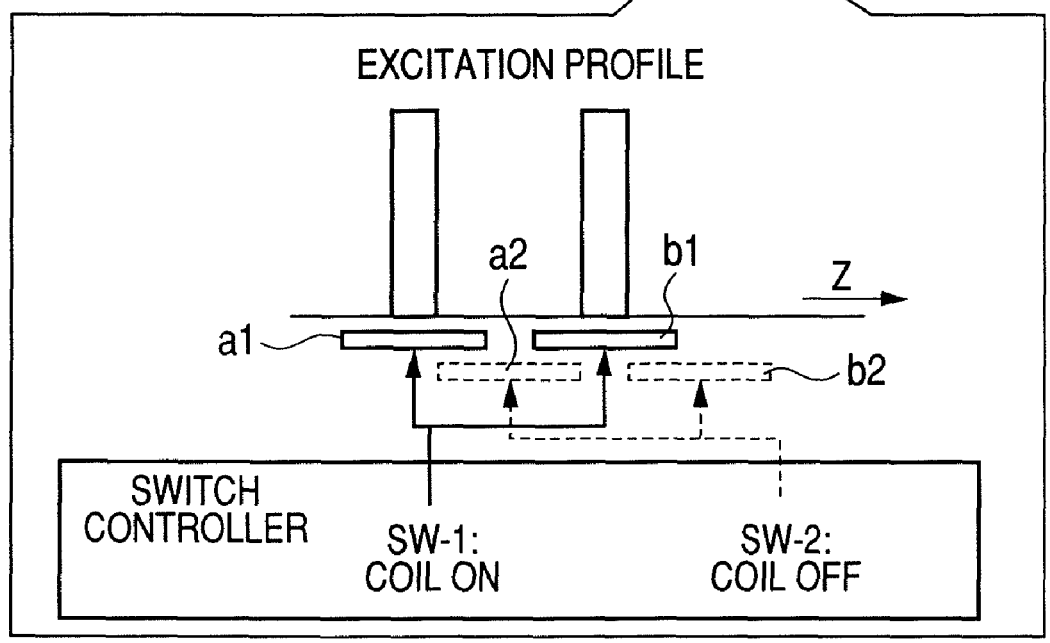

FIG. 13
COIL STRUCTURE
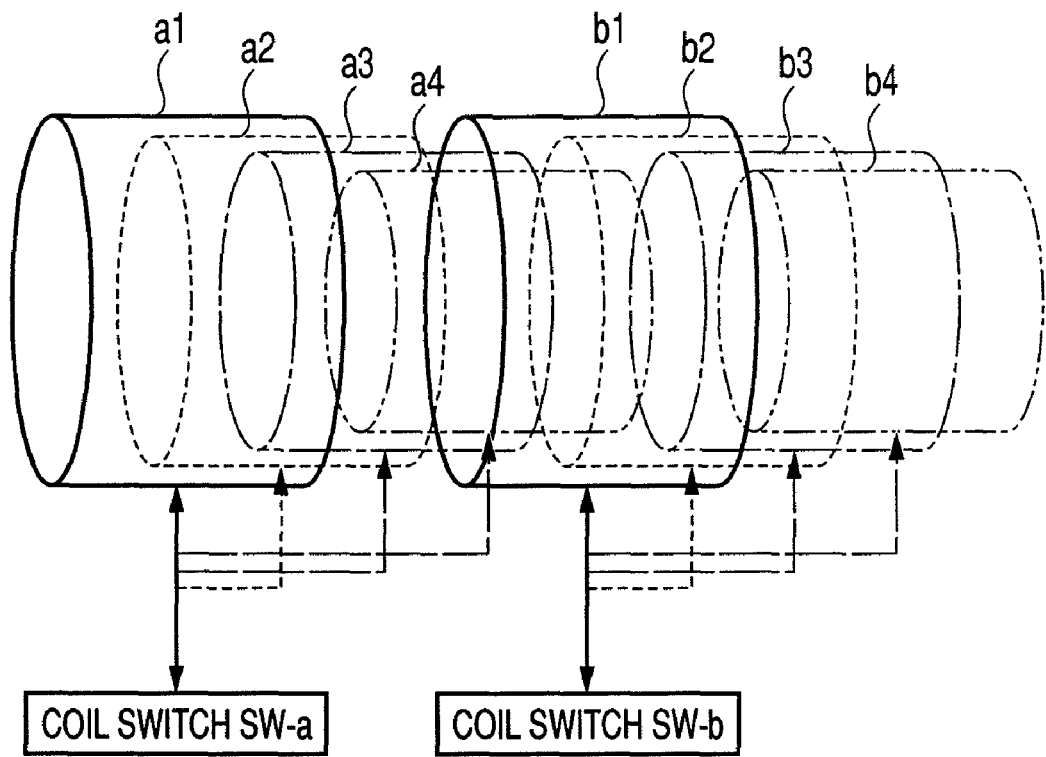
SENSITIVITY PROFILES OF EVERY COILS
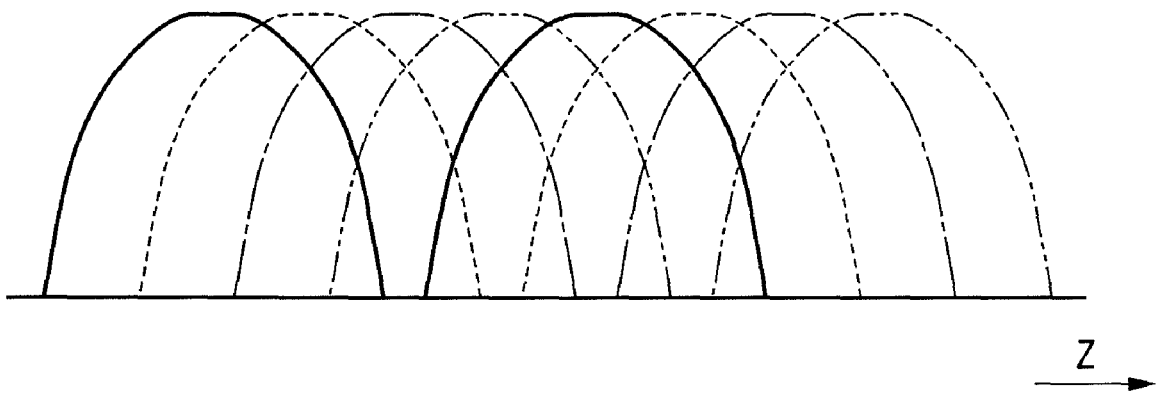

ENLARGED FIGURE OF RF COILS a1t AND a1r

FIG. 19
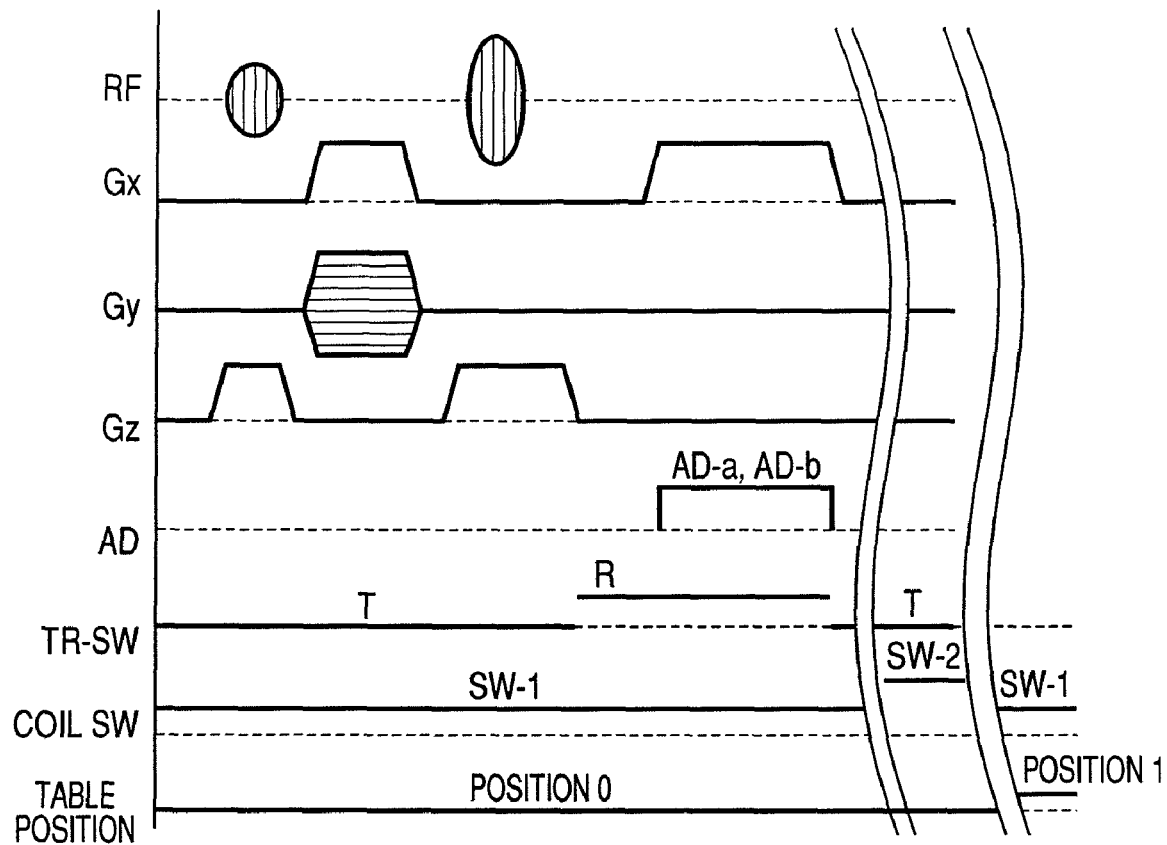
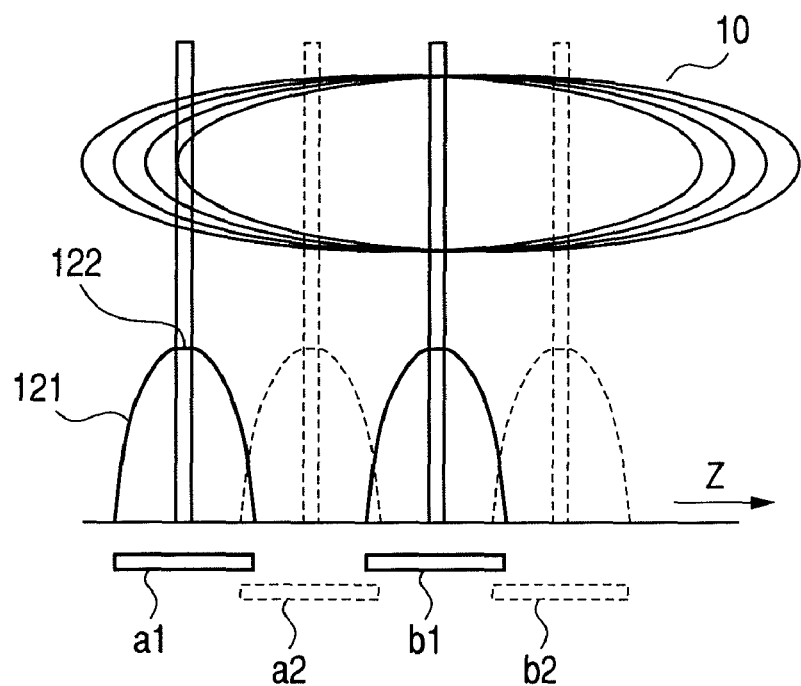

MAGNETIC RESONANCE SYSTEM AND METHOD

CLAIM OF PRIORITY

The present application claims priority from Japanese application JP 2006-007318 filed on Jan. 16, 2006, the content of which is hereby incorporated by reference into this application.

FIELD OF THE INVENTION

The present invention relates to a magnetic resonance system and a magnetic resonance measurement method, and more particularly, to the structure of an RF coil system, and a measurement method using the same.

BACKGROUND OF THE INVENTION

A magnetic resonance system is a device which transmits a radio-frequency electromagnetic field (RF) of a specific frequency to an object placed in a static magnetic field so as to induce a magnetic resonance phenomenon, and thereby acquires physicochemical information about the object.

Magnetic resonance imaging (MRI), which is now widely used, is a method of imaging the proton density and the difference of relaxation time which varies within biological tissues, mainly by using the magnetic resonance phenomenon of the protons in water molecules. A method known as spectroscopic imaging has also been proposed. This is a method of separating the magnetic resonance signals for each molecule based on the difference in the magnetic resonance frequency (chemical shift) due to the difference in the chemical bonds of a molecule, and imaging the concentration and relaxation time for each molecular species.

In the prior art, to add spatial information required for this imaging, a gradient field was applied to generate a signal whose frequency changes with position. With the spin echo method or the gradient echo method which are typical imaging methods, repeated measurements are required while varying the phase encode gradient. Therefore, there was the problem that the measurement time was too long. When the measurement time is long, there is a problem of generating motion artifacts and degrading image quality due to movement of the circulatory organs, breathing apparatus and alimentary canal of the object, and also, in diffusion imaging which measures the molecular diffusion of molecules and blood flow imaging which measures blood flow, a precise value could not be obtained.

In order to resolve these issues, measurement methods which modify the way in which the RF field or gradient is applied have been proposed. For example, there is fast SE which acquires multiple echoes at once by applying plural inversion pulses of an RF field, and echo planar which acquires multiple echoes at once using an oscillating gradient which reverses in a short cycle.

On the other hand, various methods have been proposed wherein multiple RF coils are provided, and spatial information is added using the differences in the sensitivity maps of the coils concerned.

In Patent document 1, a measurement method is proposed for using multiple RF coils without coupling. Thereby, for example, simultaneous measurement of parts which are considerably distant from each other, such as the head and the heart, can be performed.

In JP-A No. 1999-206735, a method is proposed for imaging the intersection part of the sensitivity region during transmit and the sensitivity region during receive by sequentially using multiple RF coils disposed on the circumference. This is supposed to make the gradient in the circumferential direction unnecessary.

In JP-A No. 2004-201756, an RF coil which comprises multiple RF coils and a switch for changing them over, is proposed.

In JP-A No. 2005-152657 and JP-A No. 2005-152655, a method is proposed for simultaneously transmitting RF from multiple coils to control of the shape of the excitation region and decreasing the SAR (Specific Absorption Rate).

In JP-A No. 2002-153440, a method is proposed for secondarily adding spatial information by sensitivity maps using multiple receive RF coils. In this method, the number of phase encodes is reduced, and aliasing artifacts produced thereby are removed using differences in the sensitivity maps of the RF coils.

In JP-A No. 1997-262219, a method is proposed for using one RF coil, wherein the shape of the RF field is a shape known as a DANTE pulse, a comb-like region is selectively excited, and the measurement time is shortened.

In McDougall M P, Wright S M, 64-channel array coil for single echo acquisition magnetic resonance imaging. Magnetic Resonance in Medicine, 2005, No. 54, pp. 386-392, a construction is proposed wherein multiple RF coils having thin slices as a sensitivity map are disposed in an array. For example, when the direction of the array is the Y direction, it is proposed that imaging is possible without using a phase encode gradient in the Y direction at all.

SUMMARY OF THE INVENTION

In the prior art using multiple RF coils, there is the problem that a continuous region cannot be acquired at high speed without decreasing the SN (Signal-to-noise ratio).

In the technique described in JP-A No. 1995-000370, simultaneously measuring multiple measurement parts which are distant from each other to some extent does permit rapid measurement, but it cannot be used for measurement of a continuous region. In order to measure a continuous region, the RF coils must be brought close to each other, but in this technique, the RF coils must be separated to some extent.

In JP-A No. 1999-206735, although a step which does not use a gradient is proposed, a reduction of measurement time as compared with the prior art is not particularly obtained. This is because imaging cannot be performed if measurements are not repeated while sequentially changing over the RF coil.

In JP-A No. 2004-201756, a method for changing over the RF coil is proposed. Here, the object is to change over to a high sensitivity RF coil, and the shortening of measurement time is not considered.

In Patent documents 4 and 5, although it is possible to control the shape of the measurement site, it cannot be acquired at high speed. If multiple RF coils are sufficiently separated from each other, the same effect as that of JP-A No. 1995-000370 is obtained, but it is still not possible to measure a continuous region.

In JP-A No. 2002-153440, a method of shortening measurement time by reducing the number of phase encodes using differences in the sensitivity maps of the multiple RF coils, is proposed. However, in this method, there is the problem that the SN falls with decrease of measurement time.

In JP-A No. 1997-262219, the method of making the excitation RF field pulse a DANTE pulse to shorten the measurement time, is proposed. However, in this method, the excitation region is condensed to a comb-like shape, and SN deteriorates.

McDougall M P, Wright S M, 64-channel array coil for single echo acquisition magnetic resonance imaging. Magnetic Resonance in Medicine, 2005, No. 54, pp. 386-392 further develops the measurement time shortening technique disclosed in JP-A No. 2002-153440. In this case, there is also the problem that the spatial resolution in the direction concerned is determined by the interval of the RF coils disposed in an array.

It is therefore an object of the present invention to provide a method of measuring a continuous region at high speed without reducing SN.

In the magnetic resonance system of the invention, the aforesaid object is attained by an RF receive system wherein multiple sets of RF coils, of which each set comprising multiple RF coils, are disposed such that they do not spatially interfere with at least one RF coil of an adjoining set of RF coil, RF coils of which each coil is selected from the each multiple sets of RF coils and do not mutually interfere are activated by sequentially changing over the RF coils constituting each coil set, and signals are simultaneously obtained from a number of regions equivalent to the number of coil sets.

Specifically, the magnetic resonance system of the invention comprises a static magnetic field generation system, an RF transmitter which transmits a nuclear magnetic resonance signal to an object placed in the static magnetic field, an RF receiver which receives a nuclear magnetic resonance signal from the object, and a signal processing system which generates an image and/or spectrum of the object using the nuclear magnetic resonance signal received by the RF receiver, wherein the RF receiver comprises multiple receive units and multiple coil sets connected to each of the multiple receive units, each coil set comprises multiple RF coils and is disposed in a position which does not spatially interfere with at least one RF coil of the respectively adjacent coil sets of the multiple RF coils, and further comprises a switch controller which controls ON-OFF of the RF coils to sequentially switch one of the multiple RF coils forming each coil set to ON, a coil switch which selectively connects one of the multiple RF coils to the receive unit, and a coil controller which controls the switch controller and the coil switch.

In the magnetic resonance system of the invention, for example, the RF transmitter is provided with at least one RF transmit unit and RF transmitting coil, and the multiple coil sets of the RF receiver also function as transmitting coils of the RF transmitter, and are provided with a transmit/receive switching method which changes over the receive unit and transmit unit between each coil set and the receive unit.

In the magnetic resonance system of the invention, the RF transmitter is provided with for example one or multiple transmit units and multiple coil sets, the coil sets comprise multiple RF coils and are disposed in positions which do not spatially interfere with at least one RF coil of the respectively adjacent coil sets of the multiple RF coils, and further comprise a switch controller which controls ON-OFF of the RF coils to sequentially switch one of the multiple RF coils forming each coil set to ON, a coil switch which selectively connects one of the multiple RF coils to the receive unit, and a coil controller which controls the switch controller and the coil switch.

In the aforesaid magnetic resonance system, the aforesaid RF transmitter may be provided with a transmitting unit for each coil set, and said plural coil sets may be connected to the same transmitting unit.

The transmitting coil may comprise RF coils which cover the sensitivity map regions of two or more coil sets.

In the magnetic resonance system of the invention, part of the sensitivity maps of multiple RF coils constituting the coil set mutually overlap. Typically, the multiple RF coils are arranged in a uniaxial direction.

Further, the signal processing system is provided with, for example, a correction method which corrects a sensitivity distortion of the nuclear magnetic resonance signal received by the multiple RF coils.

The magnetic resonance system comprises, for example, a moving method which moves the object in a static magnetic field, wherein the multiple coil sets are arranged in the motion direction of the object moved by to the moving method.

In the magnetic resonance measurement method of the invention, wherein an RF transmitter transmits a nuclear magnetic resonance signal to an object placed in a static magnetic field, an RF receiver receives a nuclear magnetic resonance signal from the object, and a signal processing system generates an image and/or spectrum of the object using the nuclear magnetic resonance signal received by the RF receiver, a step for transmitting an RF field to the object, and a step for switching one RF coil of multiple coil sets comprising multiple RF coils to ON, and simultaneously receiving a nuclear magnetic resonance signal for each coil set, are repeated while sequentially changing over the RF coil which is switched to ON, and an image and/or a spectrum of the object are generated using the nuclear magnetic resonance signal received by the multiple RF coils of each coil set.

In the magnetic resonance measurement method of the invention, for example, there are provided a step which transmits the RF field using the same RF coil as the coil set which receives the nuclear magnetic resonance signal, and a step which changes over the RF coil from the transmit system to the receive system after transmission of the RF field.

In the magnetic resonance measurement method of the invention, the coil set is for example arranged in a uniaxial direction, and the step which transmits the RF field generates an RF field having an excitation profile which excites multiple slices perpendicular to the array direction of the coil sets. The RF field is a pulse waveform obtained by performing an inverse Fourier transform of a desired excitation profile, or a DANTE pulse.

In the magnetic resonance measurement method of the invention, for example, the coil set is arranged in a uniaxial direction, and the step which transmits the RF field of each coil generates an RF field having an excitation profile which excites a slice perpendicular to the array direction of the coil sets. In this case, the pulse shape of the RF field may be a sinc function.

Further, in the magnetic resonance measurement method of the invention, when the step which transmits the RF field and the step which receives the nuclear magnetic resonance signal are repeated, the object is moved in the array direction of the coil sets. In the step which moves the object, the object is moved by a width narrower than the array interval of the coil sets.

In the magnetic resonance measurement method of the invention, there is provided for example a step which generates a spectroscopic image using a nuclear magnetic resonance signal received by multiple RF coils of each coil set.

According to the magnetic resonance system and measurement method of the invention, the receive RF coil is constituted by multiple coil sets comprising multiple RF coils, and by performing switching control of the RF coils and simultaneous receive from the coil sets, a measurement signal can be acquired from multiple continuous excitation slices in a short time without SN deterioration. For this reason, there is the remarkable effect that the measurement time can be shortened to the reciprocal of the number of simultaneous acquisition regions. Conversely, if the measurement time is fixed, the SN can be improved by the square root of the number of simultaneous acquisition regions. Further, in a system wherein the RF coils are split into plural groups, the remarkable effect that the SAR can be decreased, is also obtained.

BRIEF DESCRIPTION OF THE DRAWINGS

FIG. 6 is a diagram showing a measurement sequence using the RF coil system of the first embodiment;

FIG. 13 is a schematic diagram showing the RF coil system of a fifth embodiment;

FIG. 19 is a diagram showing an imaging method accompanied by object motion using the RF coil system of the invention.

DETAILED DESCRIPTION OF THE PREFERRED EMBODIMENTS

Hereafter, the most preferred forms of the invention will be described.

First Embodiment

Hereafter, a first embodiment of the magnetic resonance system of the invention and an imaging method using it, will be described.

Figure 1:
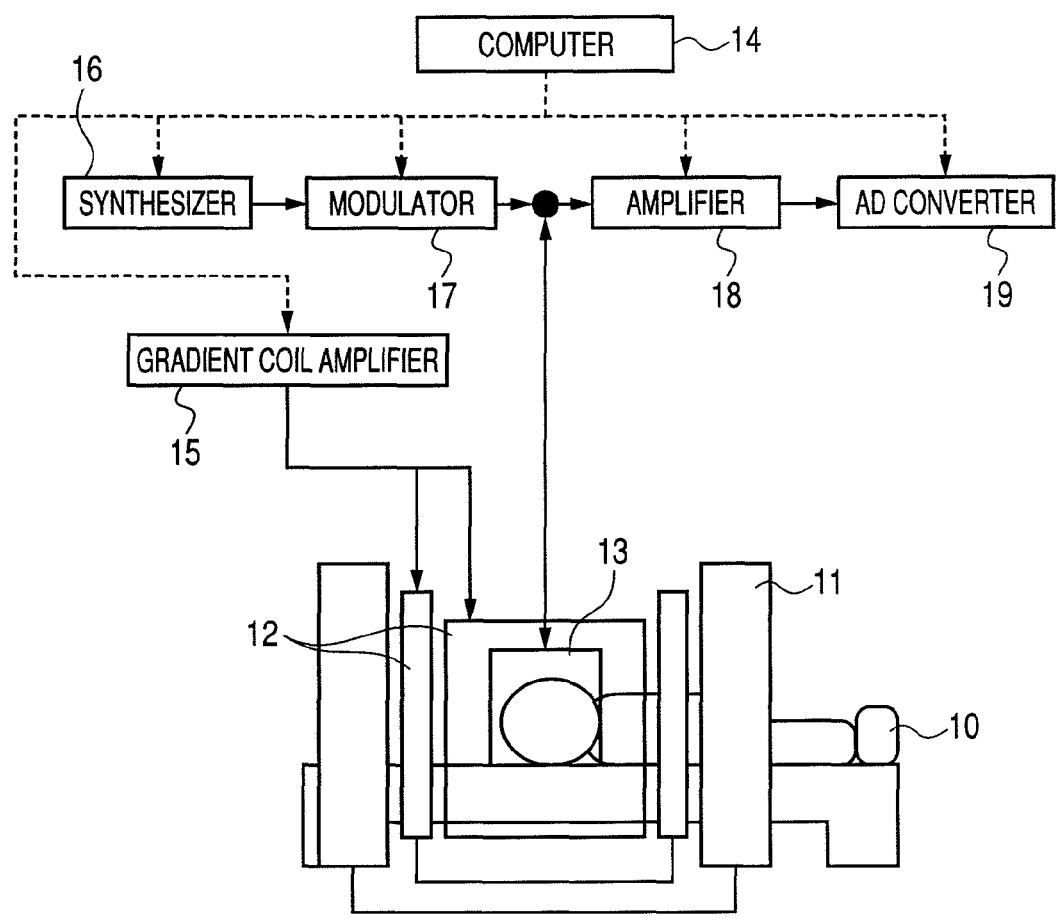
FIG. 1 is a schematic diagram showing an example of the construction of a magnetic resonance system to which the invention is applied.

FIG. 1 shows an outline of the whole magnetic resonance system to which this invention is applied. This magnetic resonance system mainly comprises a static magnetic field coil 11, gradient coil 12, RF coil system 13, computer 14, gradient coil amplifier 15, synthesizer 16, modulator 17, amplifier 18 and AD converter 19.

A synthesizer 16 and modulator 17 constitute a transmit unit. The RF field generated by the synthesizer 16 is shaped and amplified by the modulator 17, and an RF field which excites the nuclear spin of an object 10 is generated by supplying current to the RF coil system 13.

The gradient coil 12 to which current is supplied by the gradient coil amplifier 15 generates a gradient, and modulates the magnetic resonance signal from the object 10. This modulating signal is received by the RF coil system 13, and after amplification is performed by the amplifier 18 and signal acquisition is performed by the AD converter 19, it is inputted to the computer 14. The acquired data is processed and stored by the computer 14. The computer 14 also performs control so that each device operates with a preprogrammed timing and intensity.

The magnetic resonance system of the invention is distinguished by the RF coil system 13. In FIG. 1, one RF coil system 13 is shown, and if one RF coil system has both receive coils and transmit coils, it may comprise a receive RF coil system 13 and a transmit RF coil system 13. Also, only one receive unit (amplifier 18 and AD converter 19) is shown, but the receive unit comprises plural systems.

Figure 2:
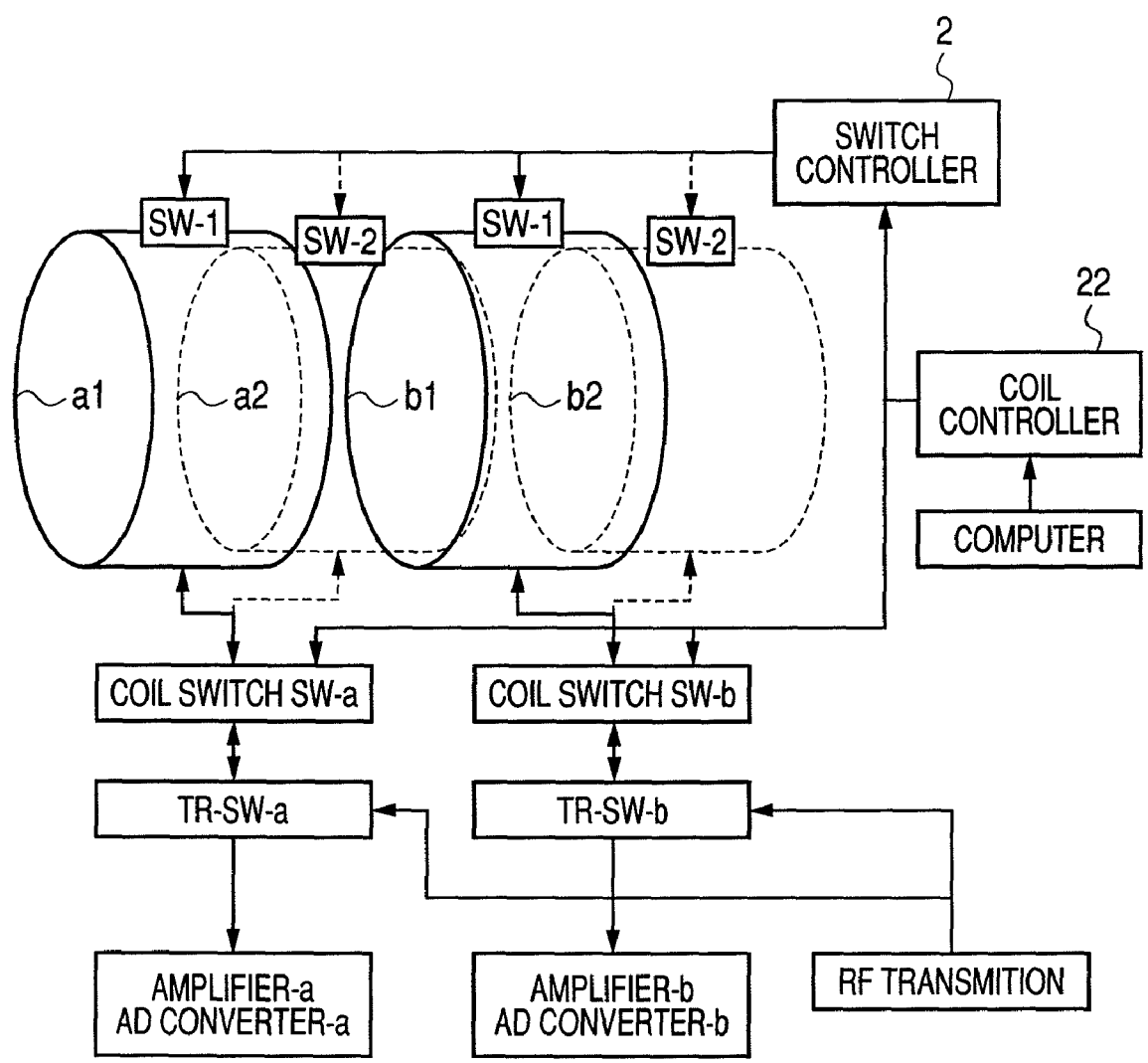
FIG. 2 is a schematic diagram showing the RF coil system of a first embodiment.

In this embodiment, the RF coil system 13 has the functions of both an RF receive system and a transmit system, and comprises multiple (n) coil sets. The multiple coil sets respectively comprise multiple (m) RF coils. The number n of coil sets and number m of coils constituting them are not particularly limited, but to simplify the description, the case of n=2 and m=2 will be described as an example. FIG. 2 schematically shows the RF coil system 13 of this embodiment.

This RF coil system 13, as shown in the diagram, comprises two coil sets a, b connected to different RF receive systems a, b, which respectively have two RF coils a1, a2, and RF coils b1, b2. The RF coils maybe any shape, such as birdcage, saddle, surface or solenoid, and they may respectively have different shapes. The RF coils may also overlap with each other to any extent. However, the RF coils a1, b1 and RF coils a2, b2 are disposed at spatially distant positions so that RF coupling is sufficiently suppressed. Specifically, the multiple RF coils (a1, b1 and a2, b2) which are electrically independent from each other, are respectively connected to different RF receive systems (a, b). In the most typical RF coil arrangement, as shown in the diagram, multiple coils Coil (i, j) (where, i=1 ... n, j=1 ... m) are spatially arranged at a predetermined interval in the order Coil (1, 1), Coil (1, 2) ... Coil (1, m), Coil (2, 1), Coil (2, 2) ... Coil (2, m) ... Coil (n, 1), Coil (n, 2) ... Coil (n, m) in a uniaxial direction (in FIG. 2, horizontal).

Each coil set is respectively connected to two RF receive systems and one transmit system via coil switches SW-a, SW-b which change over one of the multiple RF coils constituting the coil set, and switches TR-SW-a, TR-SW-b which change over transmit/receive to/from the RF coils. Each RF coil is also provided with decoupling circuits SW-1, SW-2 for suppressing the RF coupling of each RF coil. ON-OFF (active/inactive) of the decoupling circuit is controlled by a SW controller 21. The coil switches SW-a, SW-b, and SW controller 21 are controlled by a coil controller 22.

The coil controller 22 receives a control signal from the computer 14 which controls operation of the magnetic resonance system, and controls which coil is activated. Specifically, among the multiple RF coils constituting each coil set, the SW controller 21 is controlled to make sets of RF coils at locations which are spatially distant from each other, e.g., the decoupling circuit SW-1 of the coils a1, b1 active, and the decoupling circuit SW-2 of the other coils (coils a2, b2), inactive; and simultaneously, a control signal is sent to the coil switches SW-a, SW-b so that a coil system 1 (coils a1, coil b1) is active, and a coil system 2 (coils a2, b2) is inactive.

The operation of the switches TR-SW-a, TR-SW-b which change over transmit and receive to the RF coil, is controlled by a function of the computer 14 which controls measurement.

Figure 3:
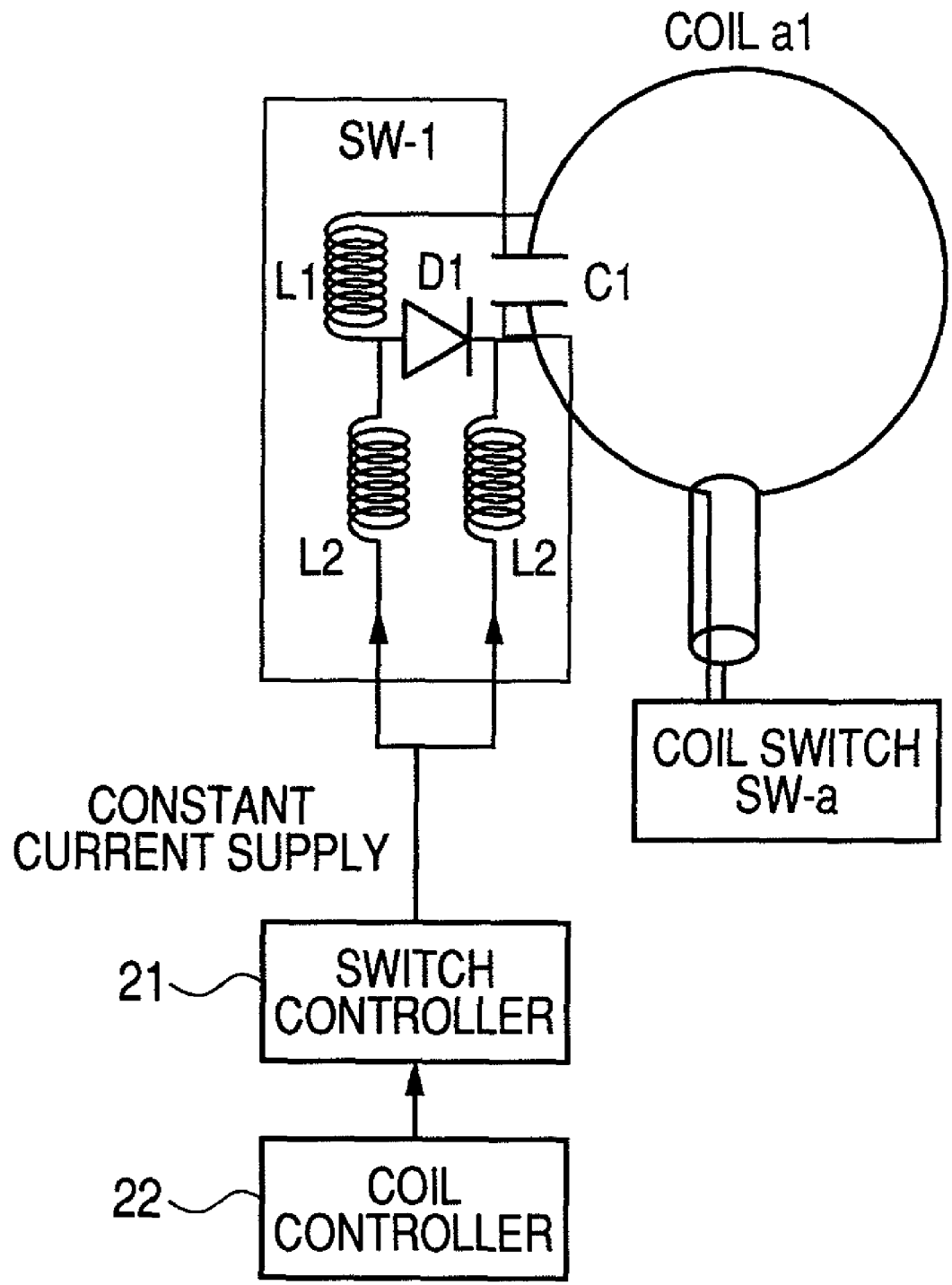
FIG. 3 shows a decoupling circuit of the RF coil used in the invention.

Next, the construction and the method of controlling the decoupling circuits SW-1, SW-2 will be described. FIG. 3 is a schematic diagram of a decoupling circuit.

FIG. 3 shows only the decoupling circuit SW-1 of the coil a1, but since the other decoupling circuits are the same, they are not shown. When multiple receiving coils such as the RF coil system of the invention are arranged in sequence, decoupling is required to reduce the mutual interference between coils and prevent the contamination of the signals received from each coil, and some methods for doing this have already been devised. FIG. 3 shows an example. In each RF coil of FIG. 3, a resonant circuit according to the magnetic resonance frequency of the object nucleus is formed by a capacitor C1 with a conductor L1, and ON-OFF of the resonant circuit is performed by the ON-OFF of a diode D1. This controls the ON-OFF for each receiving coil, and permits decoupling. The circuit illustrates an example when the number of diodes is one, but it is preferable to consider switching multiple diodes ON-OFF simultaneously, and performing ON-OFF control using a constant current source. Conductors L2 are inserted in order to prevent noise from the power supply near the nuclear magnetic resonance frequency mixing with the signal line.

For the devices D1, C1, L1, L2 constituting the decoupling circuit, it is preferable to use perfectly nonmagnetic materials. For the diode D1, it is preferable to use a material with as low a resistance as possible. For the capacitor C1, it is preferable to use a material with as high a Q value as possible.

FIG. 3 shows the case where the RF coil is a surface coil, but with coils other than a surface coil such as a saddle coil or a birdcage coil, a circuit which performs ON-OFF control as shown in FIG. 3 may be inserted in each resonant circuit.

Figure 4:
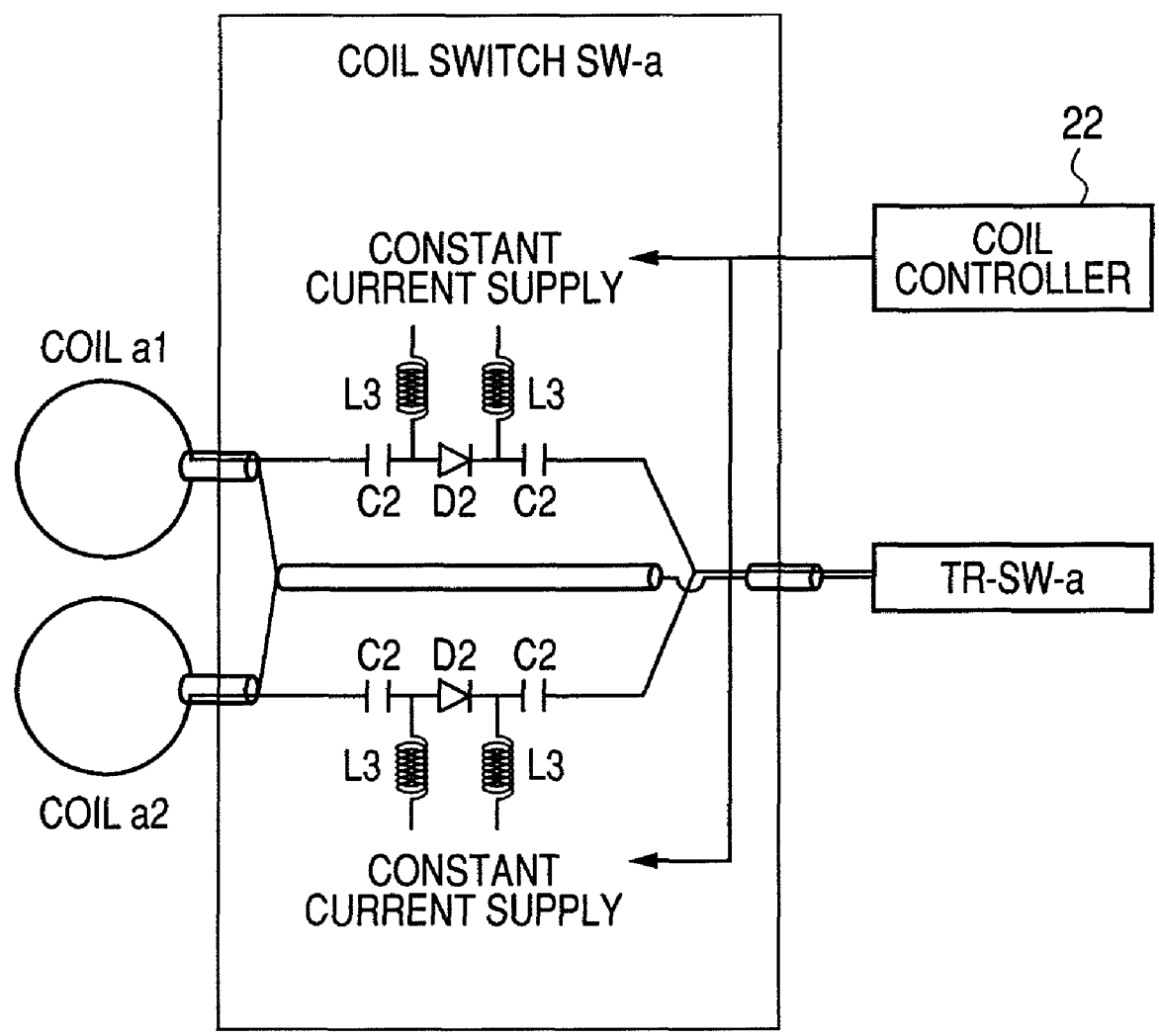
FIG. 4 is a diagram showing an example of the construction of the coil switch of an RF coil used in the invention.

Next, the specific construction and method of controlling the coil switch SW will be described. FIG. 4 is a figure showing an example of the coil switch SW. In the circuit of FIG. 4, diodes D2 are inserted in the middle of the signal line connected to the amplifier from each RF coil. By controlling the current which flows into each of the diodes D2, the electrical conduction of each signal line can be switched ON-OFF, which permits selection of the RF coil connected with the amplifier. The diodes D2 to which a constant current is supplied, are controlled by a signal from the coil controller 22. Conductors L3 are inserted in order to prevent noise from the power supply near the nuclear magnetic resonance frequency mixing with the signal line. For the diodes D2, the capacitors C2 and conductors L3 constituting the switch SW, it is preferable to use nonmagnetic materials as far as possible. For the diodes D2, it is preferable to use a material of as low a resistance as possible, and for the capacitors C2, it is preferable to use a material of as high a Q value as possible.

Figure 5:
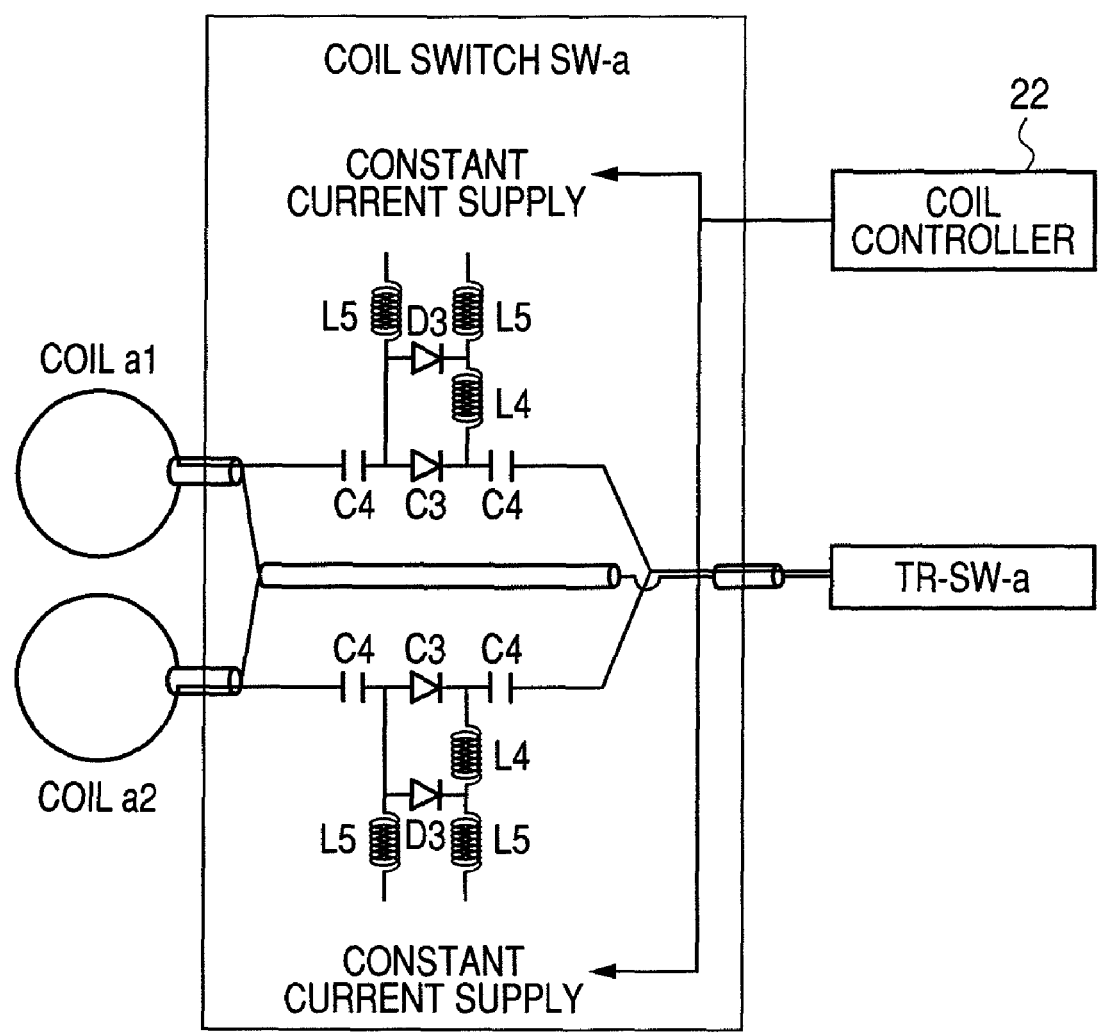
FIG. 5 is a diagram showing another example of the construction of the coil switch of the RF coil used in the invention.

FIG. 5 shows another example of the coil switch SW. In the circuit of FIG. 5, the resonant circuit at the nuclear magnetic resonance frequency is formed by the conductors L4 and the capacitors C3, ON-OFF of the resonant circuit is performed by switching diodes D3 ON-OFF by current control, and the electrical conduction of each signal line is switched ON-OFF. The unit to which a constant current is supplied, is changed over by a signal from the coil controller. Conductors L5 are inserted to prevent noise from the power supply near the nuclear magnetic resonance frequency mixing with the signal line, and in this example also, for the diodes D3, capacitors C3, C4 and conductors L4, L5 constituting the coil switch SW, it is preferable to use nonmagnetic materials as far as possible. For the diodes D3, it is preferable to use a material with as low a resistance as possible, and for the capacitors C3 and capacitors C4, it is preferable to use a material with as high a Q value as possible.

In FIG. 4 and FIG. 5, only the coil switch SW-a is shown, but the other coil switches SW have an identical construction.

Next, the measurement method using the RF coil system of this embodiment will be described. FIG. 6 shows a typical example of a measurement sequence. The upper part of FIG. 6 is a sequence diagram, wherein the horizontal axis is time, the vertical axis shows the electromagnetic field RF, gradients Gx, Gy, Gz, data acquisition AD, transmit/receive switch TR-SW and coil switch Coil SW, and the diagram shows respective timings and intensities. Here, the operation of the system will be described taking the case of a spin echo sequence. In this sequence, for convenience, the axial direction of the RF coil system of FIG. 1 (horizontal direction) will be taken as the z axis.

First, the TR-SW is set to transmit T, the Coil SW is set to SW-1, and an RF excitation pulse is applied while applying the slice gradient Gz. In this case, as shown in the lower part of FIG. 6, the slice gradient Gz and RF excitation pulse are adjusted so that the excitation profile is a plane perpendicular to the coils a1, b1. The method of adjusting the RF excitation pulse will be described later using FIG. 7. Next, the readout gradient Gx is applied so that the magnetic resonance signals in the excitation region connect echoes. Also, to acquire spatial information in the y direction, the phase encode gradient Gy is applied. Next, an RF inversion pulse is applied while applying Gz. Here also, the intensity and the phase of Gz and the RF excitation pulse are adjusted so that the magnetic resonance signal excited by the excitation pulse is inverted.

Typically, the excitation pulse is a 90° pulse for which a magnetism is rotated by 90°, and the inversion pulse is a 180° pulse which has twice power of the excitation pulse with inverted phase. It will of course be understood that the intensity of the pulse may be weakened, e.g. a 30° pulse may be used instead.

Next, the TR-SW is changed over to receive R, and while applying the read-out gradient Gx to generate the magnetic resonance signal echoes, data acquisitions AD-a, AD-b for the data RF receive systems a, b are performed. Here, control is performed so that only the RF coils a1, b1 are active, and the RF coils a2, b2 are inactive. Since the RF coils a1, b1 are sufficiently spatially separated, even if both are active, RF coupling does not occur. Of course, since SW-2 is inactive, RF coupling with a2, b2 does not occur either. Hence, the result is as if the RF coils a1, b1 acquire signals independently. In other words, the signals from two excitation slices can be acquired simultaneously without any SN deterioration.

The process from the RF excitation pulse to the data acquisitions AD-a, AD-b is repeated while varying the amplitude of the phase encode gradient Gy, and data for a predetermined number of phase encodes, i.e., data for a two-dimensional image, is thus obtained.

Next, the Coil SW is changed over to SW-2, an identical loop is repeated, and a 2-dimensional image is acquired. If the number (m) of RF coils constituting the coil set exceeds 2, the measurement is repeated while shifting the position of the excitation slice in the z axis direction, and an image of a 3-dimensional region is thereby acquired. By repeating measurements in this way, all continuous regions can be measured.

Either the repeated loop which varies the phase encoding, or the repeated loop which varies the position of the excitation profile, may be performed first. In other words, for a phase encoding is fixed, the sequence shown in FIG. 6 wherein the Coil SW is changed over from SW-1 to SW-2 may be executed first, the phase encoding changed after that, and the Coil SW changed over from SW-1 to SW-2 again under the changed phase encoding. If the loop (assumed to be an internal loop) which changes the excitation slice position is executed first, it is not necessary to wait for relaxation of nuclear magnetism in the excitation slice, so the measurement repetition time (TR) can be shortened and the measurement time can be shortened.

Figure 7:
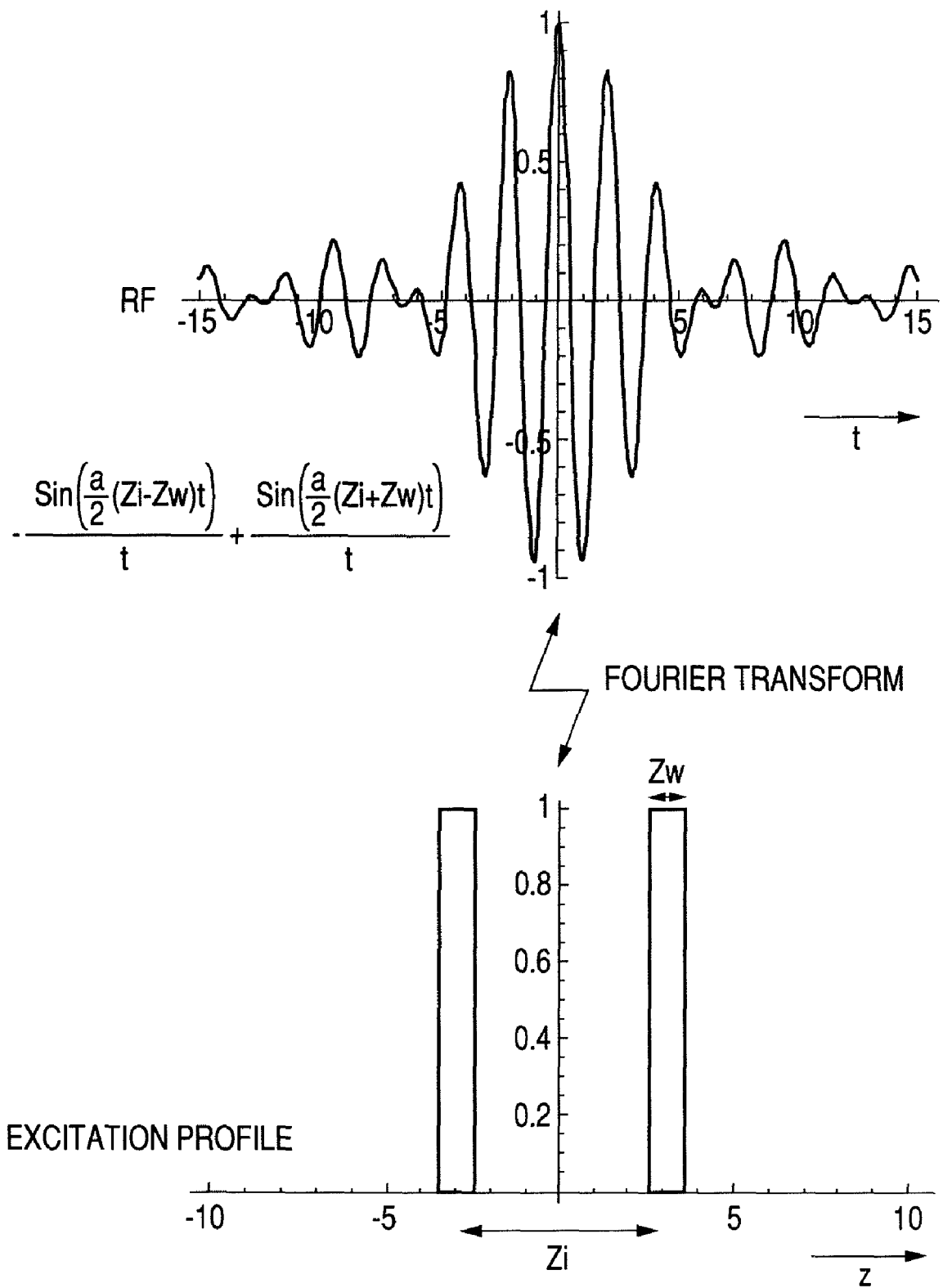
FIG. 7 is a diagram showing an example of an RF field wave used in the invention.

FIG. 7 shows an example of an RF excitation pulse for implementing the excitation profile shown in the lower part of FIG. 6. When the Gz amplitude is constant, the excitation profile and the shape of the RF excitation pulse have a Fourier transform relation. Therefore, the shape of the RF excitation pulse which gives this excitation profile can be found by performing the inverse Fourier transform of the target excitation profile. To obtain the excitation profile shown in the lower part of FIG. 7, an RF excitation pulse having a shape expressed by the summation of the sinc function in the upper part of the diagram, may be applied. Since the transmit time of the RF pulse is limited, this pulse may not be applied with this shape. For example, a shaping operation is required to cut it off at a limiting time. Here, if it is simply cut off within a limiting time, the shape of the excitation profile may collapse. In order to prevent this, a correction may be applied such as multiplying the pulse by a Hamming function or the like. It is thus also possible to perform a certain amount of wave correction, and to optimize the excitation profile.

The RF excitation pulse shown in FIG. 7 is a typical example, but the invention is not restricted thereto. Although the embodiment shown in FIG. 2 showed the case where the number of transmit systems was one, the number of transmit systems can be made to correspond to the number of coil sets (in the example of FIG. 2, the two systems a, b), and in the case of a device having independent transmit systems for each coil set, it is also possible to simplify the RF excitation pulse. For example, from the transmit system a, a sinc function having the frequency and width for exciting the excitation profile written to the RF coil a1 may be applied, and from the transmit system b, a sinc function having the frequency and width for exciting the excitation profile written to the RF coil b1, may be applied, respectively. It is also possible, by not setting Gz amplitude constant but by varying it, to optimize the shape of the excitation profile during RF application. This method is described for example in Proc. Intl. Soc. Mag. Reson. Med. 11 (2004) "Time-Optimal VERSE Excitation for 3 D balanced SSFP Imaging".

Regarding the RF inversion pulse, a setting may be performed so that the intensity of the RF excitation pulse of FIG. 7 is exactly a 180° pulse. Alternatively, a pulse which does not have spatial selectivity, or a sinc function which broadly inverts the region, may be used as the RF inversion pulse. In the latter case, when exciting using the coil system 1, it may be excited up to the coil system 2, and a long repetition time (TR) may have to be allowed.

According to the method of this embodiment, two excitation slices can be measured simultaneously, so there is no SN deterioration and signals can be acquired from all regions in half the measurement time. Conversely, in the same measurement time, twice as many signal integrations can be performed and the SN can be boosted by $\sqrt{2}$ times. These effects depend on the number of systems in the receive unit, and if the number of systems is n (n≧2), the number of excitation slices which can be acquired simultaneously is n and the measurement time is 1/n. Conversely, in the same measurement time, n times the number of signal integrations can be performed, and the SN can be boosted by $\sqrt{n}$ times. According to this embodiment, RF transmission is performed only near the active RF coil, so it is effective in reducing the SAR. This effect also depends on the overlap condition of the RF coils, and in the case where there is no overlap, about ½ the effect can be expected. These effects depend on the number of RF coils (m) constituting a coil set, and in the case where there is no overlap, a maximum effect of 1/m can be expected. From the viewpoint of protecting the object from heat rise, this SAR suppression becomes a more important factor as the static magnetic field intensity increases.

FIG. 6 shows a typical spin echo (SE) sequence, but this embodiment can be likewise applied to other measurement sequences such as the gradient echo method, the echo planar method and the fast SE method. In particular, combinations with a fast measurement sequence which can measure one slice in one measurement, such as the echo planar method and the fast SE method, are effective for improving the image quality of the chest and abdominal domain, which have a large motion. At these regions, in prior art 3-dimensional measurements where an improvement of SN was expected, motion artifacts were too large, but in the method of this embodiment, since multiple slices are measured simultaneously, the measurement time is shortened and motion artifacts are effectively suppressed.

Second Embodiment

A second embodiment of the invention will now be described referring to FIGS. 8 and 9. The magnetic resonance system of this embodiment is characterized in that the RF coil of the transmit system is separate from the RF coil of the receive system, and the RF coils of the receive system comprises multiple coil sets having multiple RF coils, respectively. The construction of the magnetic resonance system to which this embodiment is applied is identical to that shown in FIG. 1.

Figure 8:
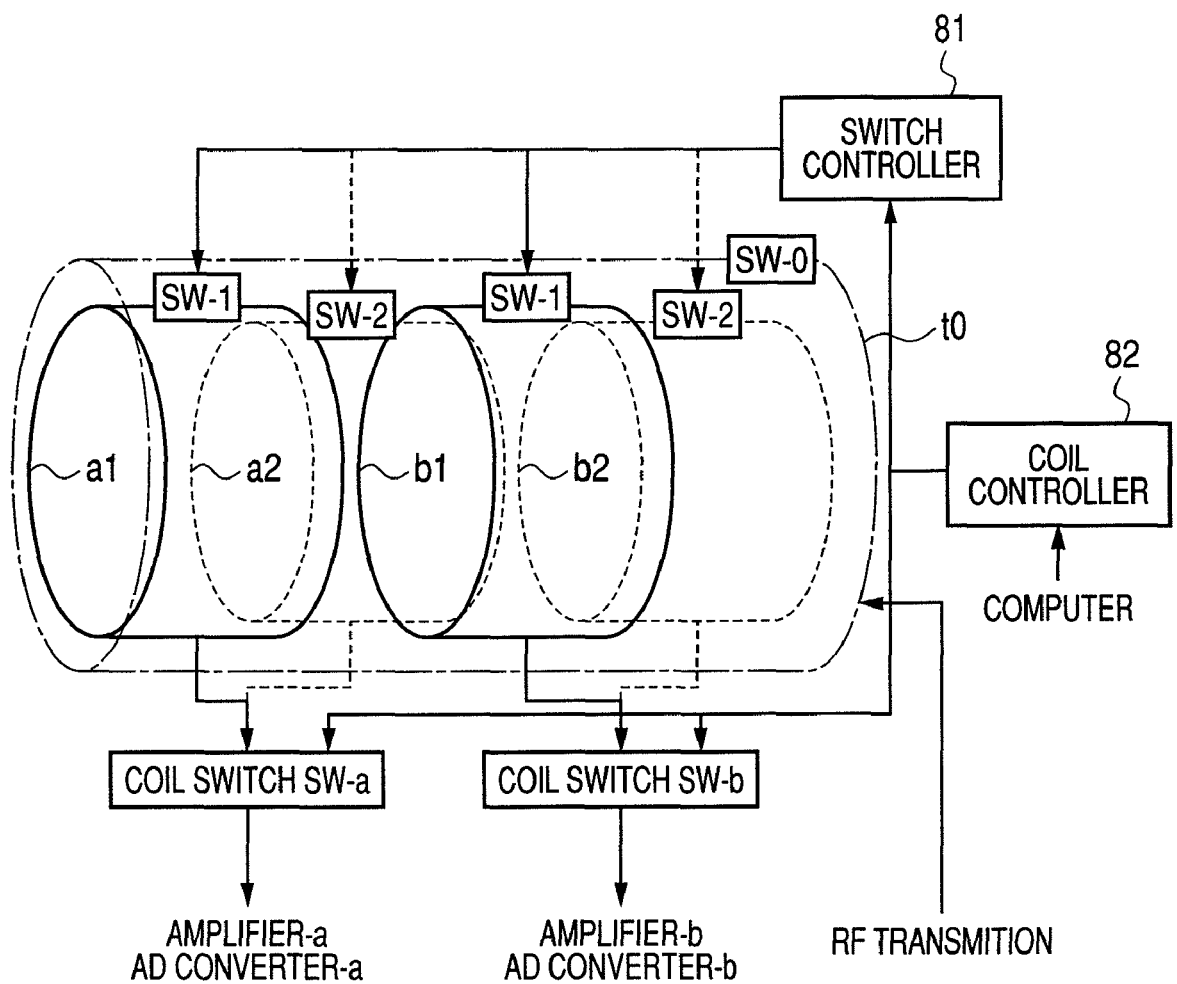
FIG. 8 is a schematic diagram showing the RF coil system of a second embodiment.
Figure 9:
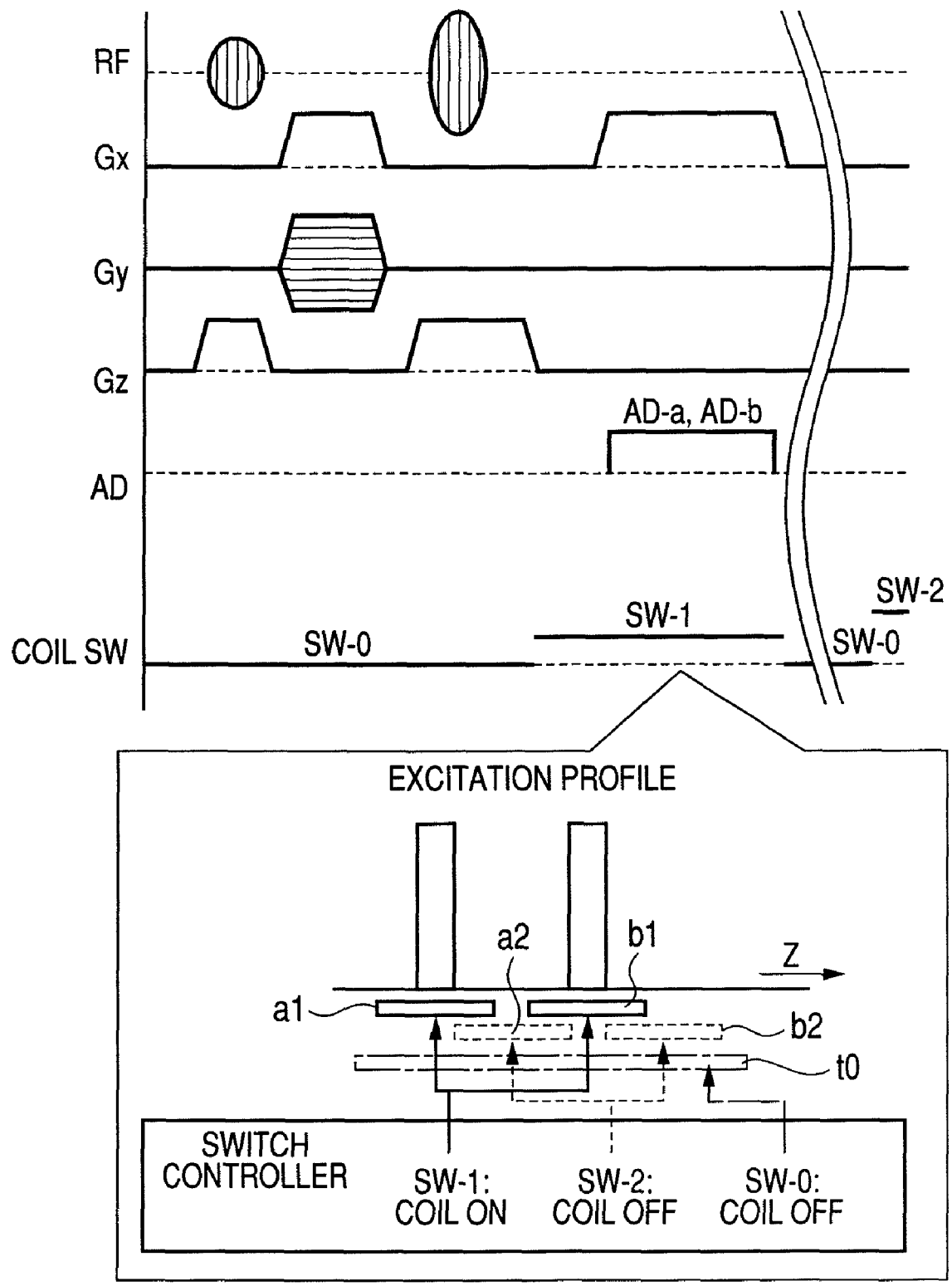
FIG. 9 is a diagram showing a measurement sequence using the RF coil system of the second embodiment.

FIG. 8 shows a schematic diagram of the RF coil system of this embodiment. In FIG. 8, one RF transmit coil is connected to one transmit unit and two RF coil sets, each set constitute of two RF coils, are connected to two receive units, but in general, there are n receive units and m RF coil sets respectively connected thereto (where, n and m are positive integers). In this embodiment, for simplicity, the case of n=2 and m=2 is described.

The RF coil system of this invention comprises one transmit RF coil t0, plural receive RF coils a1, a2, b1, b2, decoupling circuits SW-0, SW-1, SW-2 for suppressing RF coupling, a SW controller 81 which controls active/inactive of these decoupling circuits, coil switches SW-a, SW-b that determine the RF coil to/from which transmit/receive should be performed, and a coil controller 82 which controls the switching of these RF coils. The RF coils may be any shape, such as birdcage, saddle, surface or solenoid, and they may respectively have different shapes. Also, the receive RF coils can overlap to any extent. However, the receive RF coils a1, b1, a2, b2 must be disposed at spatially distant positions so that RF coupling is sufficiently suppressed, and the transmit RF coil t0 is disposed so that the sensitivity regions of the all receive RF coils are covered. As shown in the diagram, in the most typical arrangement of RF coils, multiple coils Coil (i, j) (where i=i . . . n, j=1 . . . m) are spatially arranged at a predetermined interval in the order Coil (1, 1) Coil (1, 2) . . . Coil (1, m), Coil (2, 1), Coil (2, 2) . . . Coil (2, m) . . . Coil (n, 1), Coil (n, 2) . . . Coil (n, m) in a given uniaxial direction (horizontal in FIG. 8).

The construction and method of controlling the decoupling circuits SW-0, SW-1, SW-2 are identical to those described using FIG. 3 in the first embodiment, and the construction and method of controlling the coil switches SW-a, SW-b are identical to those described using FIGS. 4 and 5 in the first embodiment, so their descriptions will be omitted.

The coil controller 82 receives a control signal from the computer 14 which controls the operation of a magnetic resonance system, and controls which coil is activated. For example, when activating the coils a1, coil b1, control signals are emitted to set SW-1 to active, set SW-2 to inactive, and set the coil system 1 to active and the coil system 2 to inactive by the coil switches SW-a, SW-b.

The measurement method using the RF coil system of this embodiment will now be described. FIG. 9 shows a typical example of a measurement sequence. Here, the case of a spin echo sequence will be described, but it may be another measurement sequence. The upper part of FIG. 9 is a sequence diagram where the horizontal axis is time, the vertical axis shows the electromagnetic field RF, gradients Gx, Gy, Gz, data acquisition AD, and coil switch Coil SW, and the diagram shows respective timings and intensities. In this sequence, for convenience, the axial direction of the RF coil system of FIG. 8 will be taken as the z axis.

First, the Coil SW is set to SW-0, and an RF excitation pulse is transmitted while applying the slice gradient Gz. In this case, as shown in the lower part of FIG. 9, the slice gradient Gz and RF excitation pulse are adjusted so that the excitation profile is a plane perpendicular to the coils a1, coil b1. The method of adjusting Gz and the RF excitation pulse is identical to that of the first embodiment described using FIG. 7. Next, the read-out gradient Gx is applied so that the magnetic resonance signals in the excitation region generate echoes. Also, to acquire spatial information in the y direction, a phase encode gradient is applied. Next, an RF inversion pulse is applied while applying the slice gradient Gz. Here also, the intensity and phase of Gz and the RF excitation pulse are adjusted so that the magnetic resonance signal excited by the excitation pulse is inverted.

Next, the Coil SW is changed over to SW-1, and data acquisitions AD-a, AD-b are performed by both the data RF receive systems a, b while applying the read-out gradient Gx to generate the echoes of the magnetic resonance signals. Here, control is performed so that only the RF coils a1, b1 are active, and the RF coils a2, b2, t0 are inactive. The RF coils a1 and b1 are sufficiently spatially separated, so even if both are active, RF coupling does not occur. Of course, since SW-0 is inactive, RF coupling with t0 does not occur, and since SW-2 is inactive, RF coupling with a2, b2 does not occur either. For this reason, the situation is the same as if the RF coils a1, b1 acquire signals independently. In other words, the signals from two excitation slices can be acquired simultaneously without any SN deterioration.

The sequence from the RF excitation pulse to the data acquisitions AD-a, AD-b is repeated while varying the amplitude of the phase encode gradient Gy, and data for a predetermined number of phase encodes, i.e., data for a 2-dimensional image, is obtained.

In the following loop, the decoupling circuit SW is changed over from SW-0 to SW-2, the same measurement sequence is repeated and a two-dimensional image is acquired. If the number (m) of RF coils constituting the coil set is larger than 2, measurement is repeated while shifting the position of the excitation slice in the z axis direction, and an image of a 3-dimensional region is acquired. By performing repeated measurements in this way, all continuous regions are measured. Either the repeated loop which varies phase encoding, or the repeated loop which varies the position of the excitation profile, may be executed first.

According to the method of this embodiment, as in the first embodiment, since two excitation slices can be measured simultaneously, a signal can be acquired from all regions in half the measurement time without any SN deterioration. Conversely, in the same measurement time, twice as many signals can be integrated and the SN can be improved by $\sqrt{2}$ times.

In this embodiment, as compared with the first embodiment, the single RF coil t0 which covers the whole region is used as a transmit system, so there is no decrease of SAR. However, in this embodiment, there is the constructional advantage that the TR-SW which changes over between transmit and receive can be omitted. It is effective also in respect of improving SN, such as by making the receive RF coil a surface coil so that local sensitivity can be improved.

In the RF coil system of FIG. 8, the two coil switches SW-a, SW-b, two amplifiers a, b and AD converters a, b are used. Instead, the coil switches SW-a, SW-b may be omitted, and four amplifiers and AD converters may be directly connected to each coil. In this case, of the four systems, only two RF receive systems connected to active coils are activated, or the data after A/D conversion is discarded. In this modification, there is the advantage that, as compared with the structure of FIG. 8, the number of coil switches SW can be reduced. Also, the construction of FIG. 8 has the major advantage that only two receive systems are required.

Third Embodiment

A third embodiment of the invention will now be described referring to FIGS. 10 and 11. The magnetic resonance system of this embodiment is characterized in that the RF coil of the transmit system is separate from the RF of the receive system, and the RF coils of the receive system comprise multiple coil sets having multiple RF coils, respectively. The construction of the magnetic resonance system to which this embodiment is applied is identical to that shown in FIG. 1.

Figure 10:
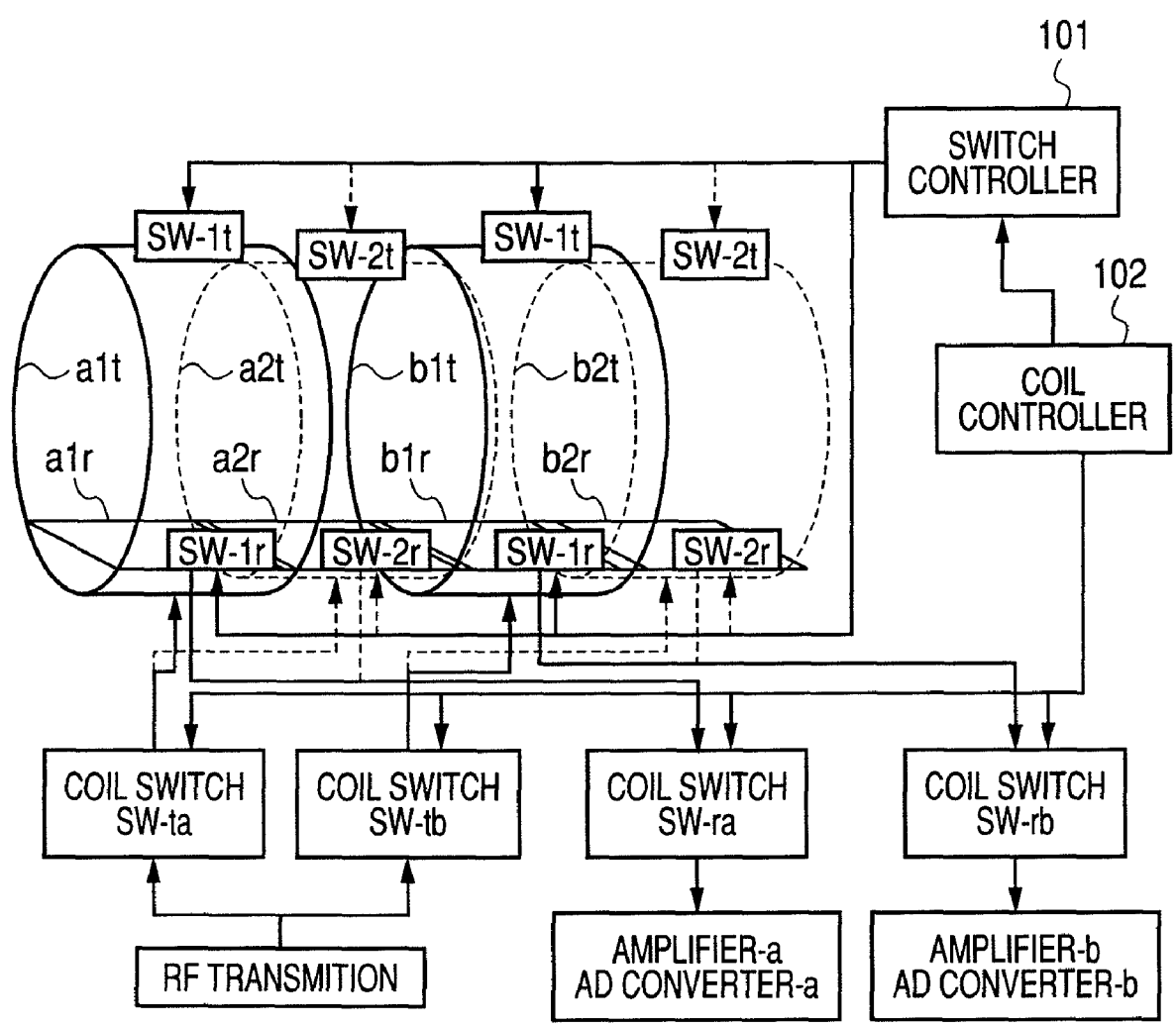
FIG. 10 is a schematic diagram showing the RF coil system of a third embodiment.

FIG. 10 shows a schematic diagram of the RF coil system of this embodiment. In FIG. 10, two RF coil sets are connected to two transmit units and other two RF coil sets are connected to two receive units, but in general, there are n receive units and m RF coils respectively connected thereto (where, n and m are positive integers). In this embodiment, for simplicity, the case of n=2 and m=2 is described.

The RF coil system of this invention comprises four transmit RF coils a1t, a2t, b1t, b2t, four receive RF coils a1r, a2r, b1r, b2r, decoupling circuits SW-1t, SW-2t, SW-1r, SW-2r for suppressing the RF coupling of these coils, a SW controller 101 which controls active/inactive of these decoupling circuits, coil switches SW-ta, SW-tb that determine the RF coil to which transmit should be performed, coil switches SW-ra, SW-rb that determine the RF coil from which receive should be performed, and a coil controller 102 which controls the switching of these RF coils.

In the examples shown in the diagrams, the transmit RF coils are volume coils such as the saddle or birdcage type, and the receive RF coils are surface coils. However, these RF coils may have any shape such as birdcage, saddle, surface or solenoid, and they may have respectively different shapes. Also, the receive RF coils can overlap to any extent. However, the receive RF coils a1, b1, a2, b2 must be disposed at spatially distant positions so that RF coupling is sufficiently suppressed. Also, the arrangement is such that the transmit RF coils cover the sensitivity regions of the respective receive RF coils. As shown in the diagram, in the most typical arrangement of RF coils, multiple coils Coil (i, j) (where i= 1 ... n, j=1 ... m) are spatially arranged at a predetermined interval in the order Coil (1, 1) Coil (1, 2) ... Coil (1, m), Coil (2, 1), Coil (2, 2) ... Coil (2, m) ... Coil (n, 1), Coil (n, 2) ... Coil (n, m) in a given uniaxial direction (horizontal in FIG. 10).

The construction and method of controlling the decoupling circuits SW-1t, SW-2t, SW-1r, SW-2r are identical to those described using FIG. 3 in the first embodiment, and the construction and method of controlling the coil switches SW-ta, SW-tb, SW-ra, SW-rb are identical to those described using FIGS. 4 and 5 in the first embodiment, so their descriptions will be omitted.

The coil controller 102 receives a control signal from the computer 14 which controls the operation of the magnetic resonance system, and controls which coil is activated. For example, when activating the coils a1t, b1t, control signals are emitted to set SW-1t to active, set SW-2t, Sw-1r, SW-2r to inactive, set the coil system 1 to active and set the coil system 2 to inactive by the coil switches SW-ta, SW-tb, and set both coil systems to inactive by the coil switches SW-ra, SW-rb.

The measurement method using the RF coil system of this embodiment will now be described. FIG. 11 shows a typical example of a measurement sequence. The upper part of FIG. 11 is a sequence diagram where the horizontal axis is time, the vertical axis shows the electromagnetic field RF, gradients Gx, Gy, Gz, data acquisition AD, and coil switch Coil SW, and the diagram shows respective timings and intensities. In this sequence, for convenience, the axial direction of the RF coil system of FIG. 10 will be taken as the z axis.

First, regarding the Coil SW, SW-1t is set to active, SW-2t, SW-1r, SW-2r are set to inactive, and an RF excitation pulse is applied while applying the slice gradient Gz. Specifically, only the RF coils a1t, b1t are set to active, and the RF excitation pulse is then transmitted. In this case, as shown in the lower part of FIG. 11, the slice gradient Gz and RF excitation pulse are adjusted so that the excitation profile is a plane perpendicular to the coils a1, coil b1. The method of adjusting Gz and the RF excitation pulse is identical to that of the first embodiment. Next, the read-out gradient Gx is applied so that the magnetic resonance signals in the excitation region generate echoes. Also, to acquire spatial information in the y direction, a phase encode gradient is applied. Next, an RF inversion pulse is applied while applying the slice gradient Gz. Here also, the intensity and phase of Gz and the RF excitation pulse are adjusted so that the magnetic resonance signal excited by the excitation pulse is inverted.

Next, the Coil SW is changed over to SW-1r, and data acquisitions AD-a, AD-b are performed by both the data RF receive systems a, b while applying the read-out gradient Gx to generate the echoes of the magnetic resonance signal. Here, control is performed so that only the receive RF coils a1r, b1r are active, while the receive RF coils a2r, b2r and the transmit RF coils a1t, a2t, b1t, b2t are inactive. The RF coils a1r and b1r are sufficiently spatially separated, so even if both are active, RF coupling does not occur. Of course, the transmit RF coils are all inactive, so here too there is no coupling, and since SW-2r is inactive, RF coupling with a2r, b2r does not occur either. For this reason, the situation is the same as if the RF coils a1r, b1r acquire signals independently. In other words, the signals from two excitation slices can be acquired simultaneously without any SN deterioration.

The sequence from the RF excitation pulse to the data acquisitions AD-a, AD-b is repeated while varying the amplitude of the phase encode gradient Gy, and data for a predetermined number of phase encodes, i.e., data for a 2-dimensional image, is obtained.

In the following loop, the decoupling circuit SW is changed over from SW-2t to SW-2r, the same loop is repeated, and a 2-dimensional image is acquired. If the number (m) of RF coils constituting the coil set is larger than 2, measurement is repeated while shifting the position of the excitation slice in the z axis direction, and an image of a 3-dimensional region is acquired. By performing repeated measurements in this way, all continuous regions are measured. Either the repeating loop which varies phase encoding, or the repeating loop which varies the position of the excitation profile, may be executed first.

According to the method of this embodiment, as in the first and second embodiments, since two excitation slices can be measured simultaneously, signals can be acquired from all regions in half the measurement time without any SN deterioration. Conversely, in the same measurement time, twice as many signals can be integrated and the SN can be improved by $\sqrt{2}$ times. These results vary depending on the number of receive units, and when the number of systems is n ($\geq 2$), the number of excitation slices which can be acquired simultaneously is n, and the measurement time is 1/n. Conversely, in the same measurement time, n times as many signals can be integrated and the SN can be improved by $\sqrt{n}$ times.

In this embodiment, as compared with the first embodiment, there is the constructional advantage that the TR-SW which changes over between transmit and receive can be omitted from the RF coil system. As compared with the second embodiment, the transmit RF coil is also split, so it has the advantage that the SAR can be decreased. Further, if a surface coil which improves local sensitivity is used for receive, SN can be improved.

In the above, as the first-third embodiments, the magnetic resonance system of the invention, and in particular the basic construction of the RF coil system and measurement method using the same, were described.

Next, a method of resolving the sensitivity distortion produced by the RF coil systems of the first-third embodiments and measurement method using the same by intensity correction of the post-processing measurement signal, will be described.

Figure 12:
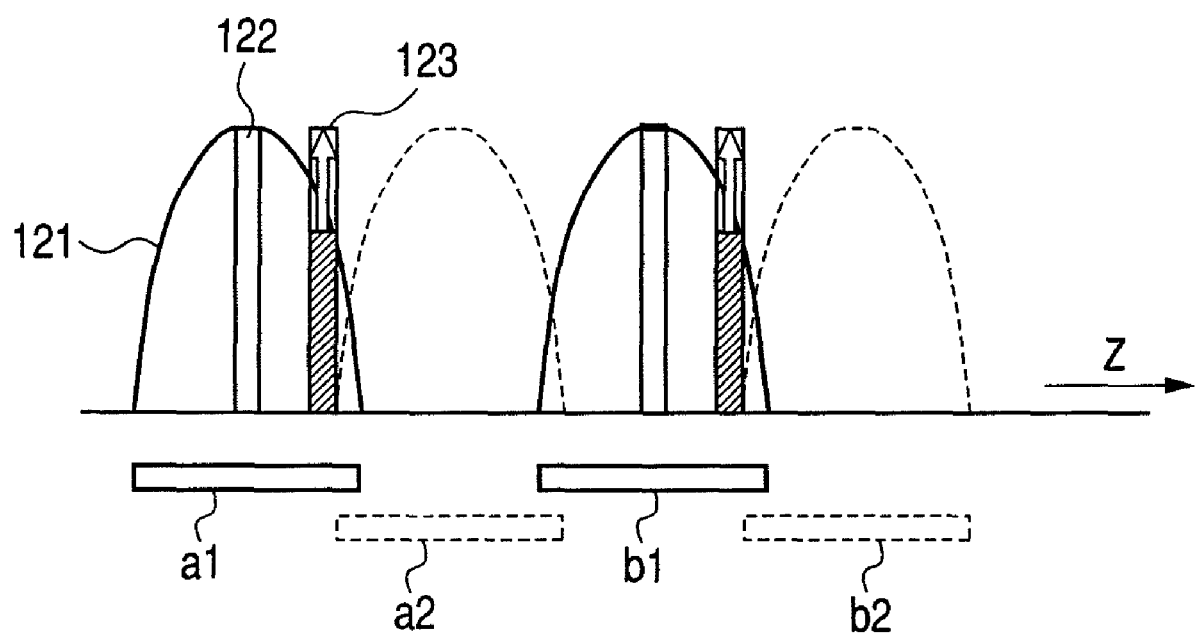
FIG. 12 is a schematic diagram showing a method of correcting the signal intensity data measured by the invention.

FIG. 12 is a schematic diagram of the sensitivity map of the RF coil system of the first-third embodiments, and the obtained measurement signal intensity. FIG. 12, where the horizontal axis is the z axis, shows the sensitivity of the four RF coils a1, a2, b1, b2. The actual sensitivity map is a 3-dimensional distribution, but here, for simplicity, only one profile line 121 for a specific sensitivity is shown. The diagram shows that the sensitivity of regions nearer to the coil than this line is high, and the sensitivity of regions further from the coil than this line is lower. The sensitivity of these RF coils decreases towards the ends. For example, in the coil center, the signal intensity is 122, but at the coil periphery, the signal intensity falls to an amount shown by the oblique line of 123.

This shows that when measuring all regions, a signal intensity error occurs in the z axis direction.

In this embodiment, to solve this problem, a signal intensity correction is performed after data acquisition. For this purpose, a correction coefficient is computed by calculating the sensitivity map of each RF coil beforehand, and saved by the computer. To calculate the sensitivity map, a measurement may be performed on a uniform sample (phantom) which simulates the object (body) beforehand, and a spatial correction coefficient calculated so that the measurement values are uniform. The data obtained by this measurement is multiplied by this correction coefficient, and taken as the corrected value.

In this case, if the phantom and the object are sufficiently similar electromagnetically, it may be considered that the sensitivity of the RF coil is effectively equivalent. For this reason, the obtained corrected value is also a value very near to the actual situation. However, if the electromagnetic properties of the phantom and object differ locally, distortion may occur in the signal intensity. In this case, instead of the method of acquiring the sensitivity map beforehand by a phantom, a uniform phantom may be placed beside the object, measurements performed simultaneously, and the correction coefficient adjusted so that the measurement value of this phantom is uniform.

Next, an example of modification of the RF coil system of the aforesaid magnetic resonance system and a modification of the magnetic resonance measurement method will be described.

Fourth Embodiment

Next, as a fourth embodiment of the invention, the construction of the RF coil system for suppressing the sensitivity distortion produced by the RF coil systems of the aforesaid first-third embodiments, and the measurement method using it, will be described. FIG. 13 shows a schematic diagram of the RF coil system of the fourth embodiment. Here, in order to simplify the description, only the RF coil and coil switch SW of the RF receive system are shown, and the decoupling circuit is omitted. The omitted part is identical to that of FIG. 1.

In this embodiment, the overlap extent of the multiple RF coils is larger, and the number of coils connected to each of the coil switches SW is increased. In this diagram, the case is shown where m=4. In this construction, as shown in the lower part of the diagram, focusing only on the sensitivity map of the center part of each coil, it is seen that, as compared with the case shown in FIG. 12, the distortion is much less.

Here, only the RF coil of the RF receive system was shown, but for the RF coil of the transmit system, the construction of the first-third embodiments may be adopted.

In other words, one RF coil system may serve both as the RF receive system and the transmit system, or the transmit system may be a single wide-area RF coil covering the sensitivity regions of all the RF coils of the RF receive system. Apart from the RF receive system, the transmit system may comprise the same RF coil system as that of FIG. 13. The shape of the excitation pulse may be the excitation profile shown, for example, in FIG. 7.

Also in the magnetic resonance system comprising this RF coil system, a measurement sequence is executed while changing over the RF coil by ON-OFF control of the decoupling circuit and simultaneously changing over the RF coil connected to the transceiver system by a coil switch, and images of slices which are spatially close are therefore acquired. In this case, the measurement sequence is adjusted, the coil having the highest sensitivity according to the position of the slice excited by RF transmission is selected, and measurement in the z axis direction is repeated. Due to this, distortion of the measured signal intensity can be suppressed.

In FIG. 13, there were m=4 coils connected to each coil switch SW, but this number may of course be increased. This permits further suppression of sensitivity distortion.

Fifth Embodiment

In the aforesaid fourth embodiment, in order to control sensitivity distortion, a system which increased the number m of RF coils connected to each receive unit was described, but the fifth embodiment shows an example where the number n of receive units is increased.

Figure 14:
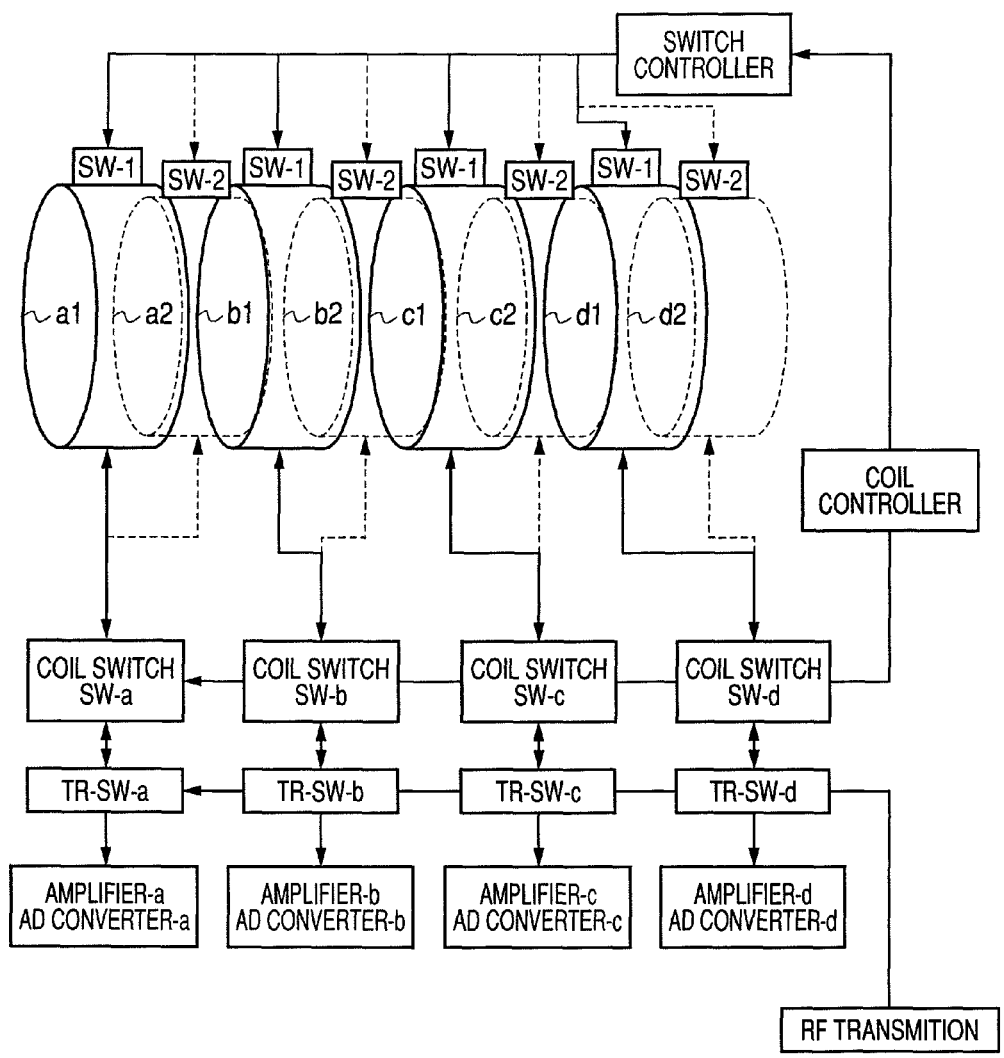
FIG. 14 is a schematic diagram showing the RF coil system of a sixth embodiment.

FIG. 14 shows a schematic diagram of the RF coil system of the invention. The difference from FIG. 1 is that the number of transmit/receive systems n=4.

The RF coil system of the invention comprises eight transmit/receive RF coils, a1, a2, b1, b2, c1, c2, d1, d2, decoupling circuits SW-1, SW-2 for controlling the RF coupling thereof, SW controller for controlling active/inactive of the decoupling circuits, coil switches SW-a, SW-b, SW-c, SW-d for changing over the RF coil to/from which transmit/receive is performed, coil controller for controlling the change-over of these RF coils, and TR-SW-a, TR-SW-b, TR-SW-c, TR-SW-d for controlling the change-over of transmit/receive of the RF coils. The construction and method of controlling the decoupling circuits SW-1, SW-2, and the construction and method of controlling the coil switches SW-a, SW-b, SW-c, SW-d, are identical to those of the first embodiment, and their descriptions will be omitted.

This embodiment shows an example which uses volume coils, such as saddle or birdcage type, for the transmit/receive RF coils. However, the RF coils maybe any shape, such as birdcage, saddle, surface or solenoid, and they may respectively have different shapes. The RF coils may also overlap with each other to any extent. However, the RF coils a1, b1, c1, d1 and RF coils a2, b2, c2, d2 are disposed at spatially distant positions so that RF coupling is sufficiently suppressed.

Figure 15:
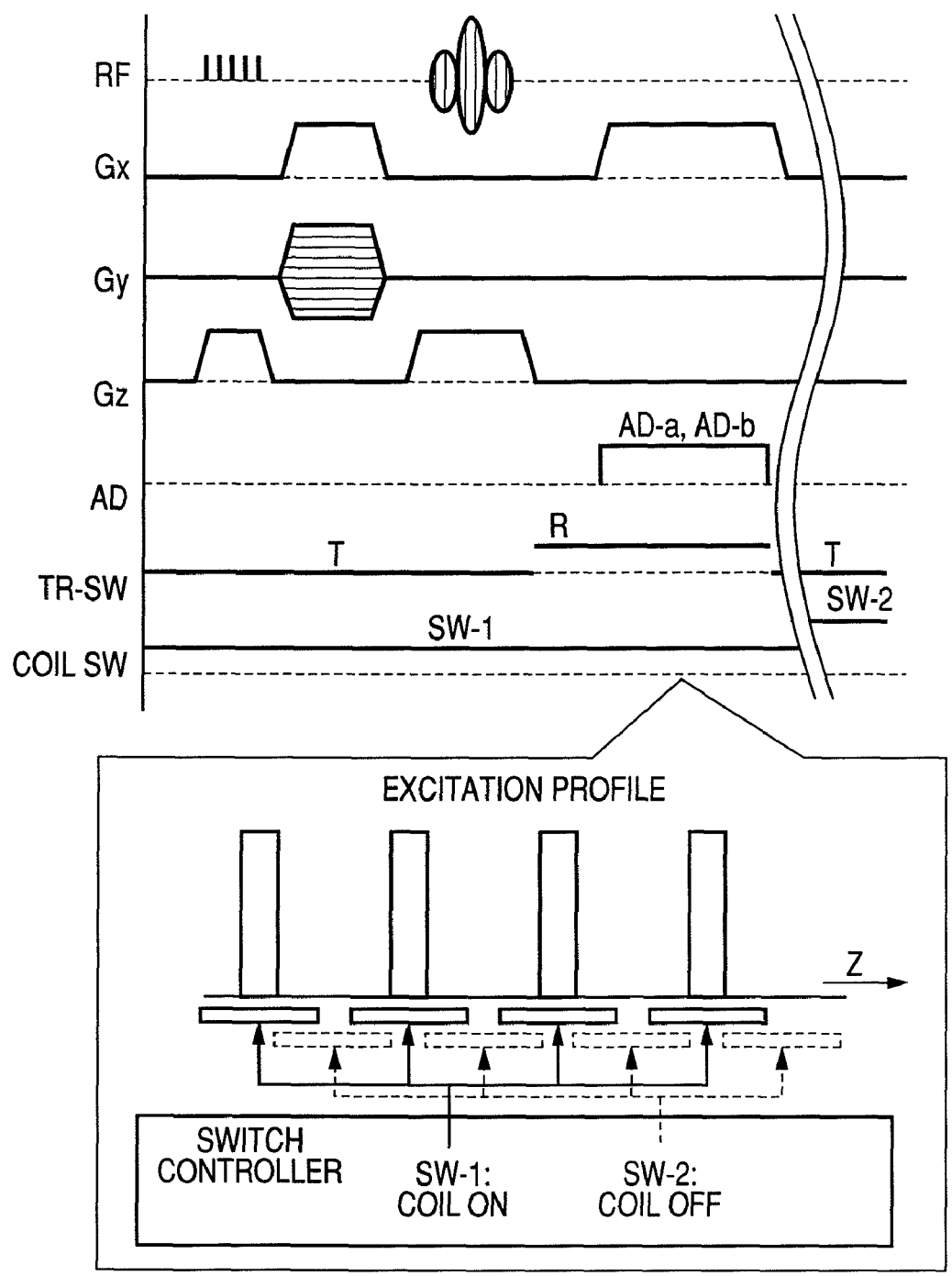
FIG. 15 is a diagram showing a measurement sequence using the RF coil system of the sixth embodiment.

FIG. 15 shows a typical example of a measurement sequence using the RF coil system of the invention. The basic operation is identical to that of the measurement sequence of FIG. 6 illustrated in the first embodiment, and its description will be omitted. A difference from the measurement sequence shown in FIG. 6 is that the number of slices excited simultaneously is increased to four. The number of measurement slices which can be simultaneously acquired is therefore four, and the measurement time can be reduced to ¼ without SN deterioration.

Another difference is the shape of the RF excitation pulse. Here, an example which applies a blip-like RF with a constant interval known as a DANTE pulse is shown. Thereby, the excitation profile can be given a comb-like profile. The DANTE pulse is described in detail in the aforesaid JP-A No. 1997-262219. Instead of the DANTE pulse, the shape of the RF excitation pulse may be calculated by performing an inverse Fourier transform of the excitation profile which has four slices.

According to the method of this embodiment, four excitation slices can be measured simultaneously, so signals can be acquired from all regions in ¼ of the measurement time without any SN deterioration. Conversely, in the same measurement time, four times as many signals can be integrated, and the SN can be increased by 2 times.

In this embodiment also, it will be understood that the measurement sequence, in addition to the SE sequence shown, may be another measurement sequence such as the gradient echo method or echo planar method.

Here, the case where the number of RF coils is 2 was described, but by combining with the fourth embodiment, the system may have both n additional receive units and m additional RF coils.

Sixth Embodiment

As a sixth embodiment, an RF coil system for further shortening the measurement time will now be described. In this embodiment, one RF coil in each embodiment described above is split into two or more in a different direction from its arrangement direction, and measurement is performed with a small number of phase encodes. Aliasing artifacts which are generated by reducing the number of phase encodes, are removed by computation using the difference in the sensitivity maps of the two or more split coils.

Figure 16:
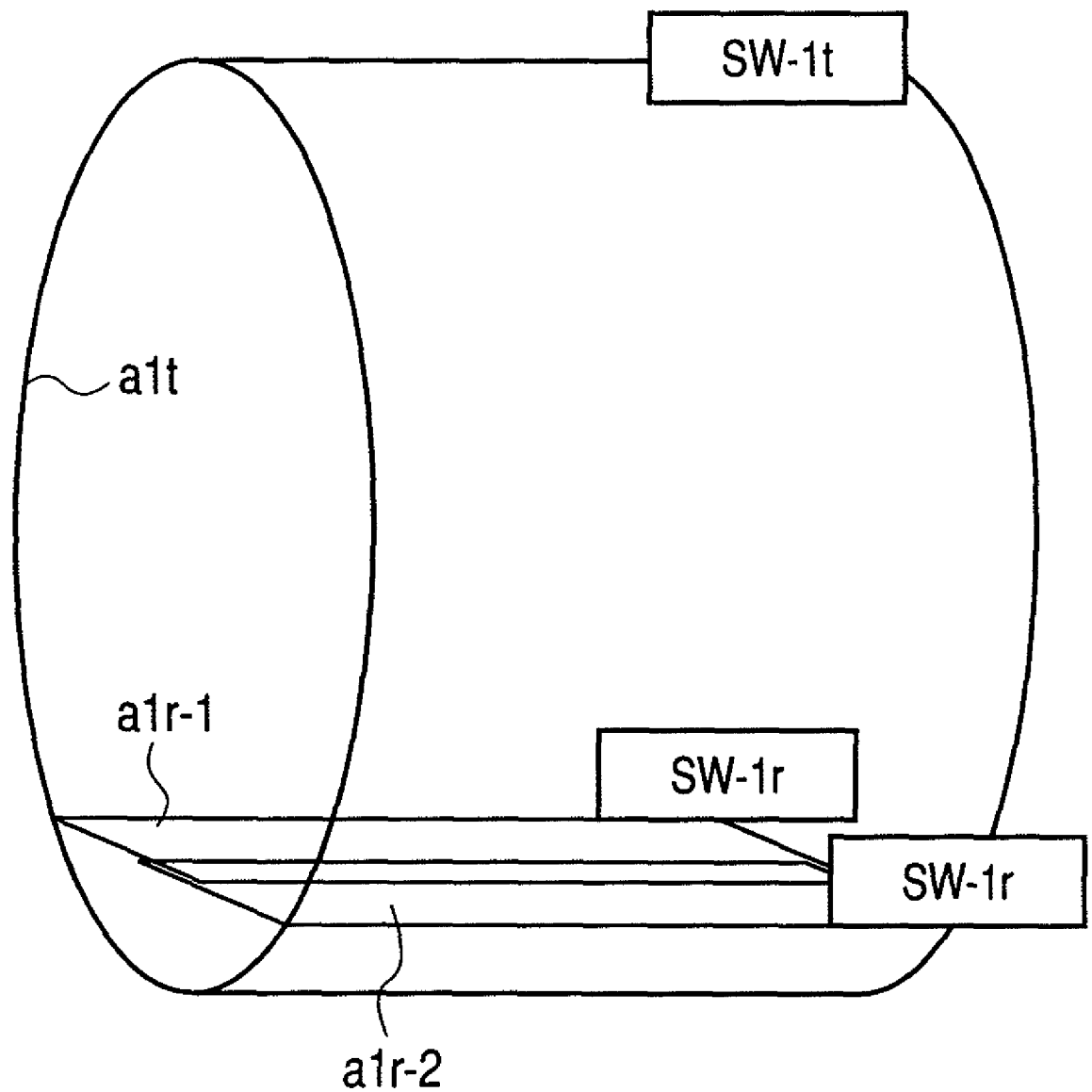
FIG. 16 is a schematic diagram showing the RF coil system of a seventh embodiment.

FIG. 16 shows an example where, of the coils in FIG. 10, the RF coils a1*t* and a1*r* are enlarged. The remaining coils are identical to those in this diagram, and are omitted. As shown in the diagram, the receive coil a1*r* is split into two in the axial direction and the perpendicular direction (y-axis), i.e., into parts a1*r*-1 and a1*r*-2. Due to this, sensitivity maps are generated in the y-axis direction. Specifically, a1*r*-1 has sensitivity behind the plane of the diagram, and a1*r*-2 has sensitivity in front of the plane of the diagram.

Figure 11:
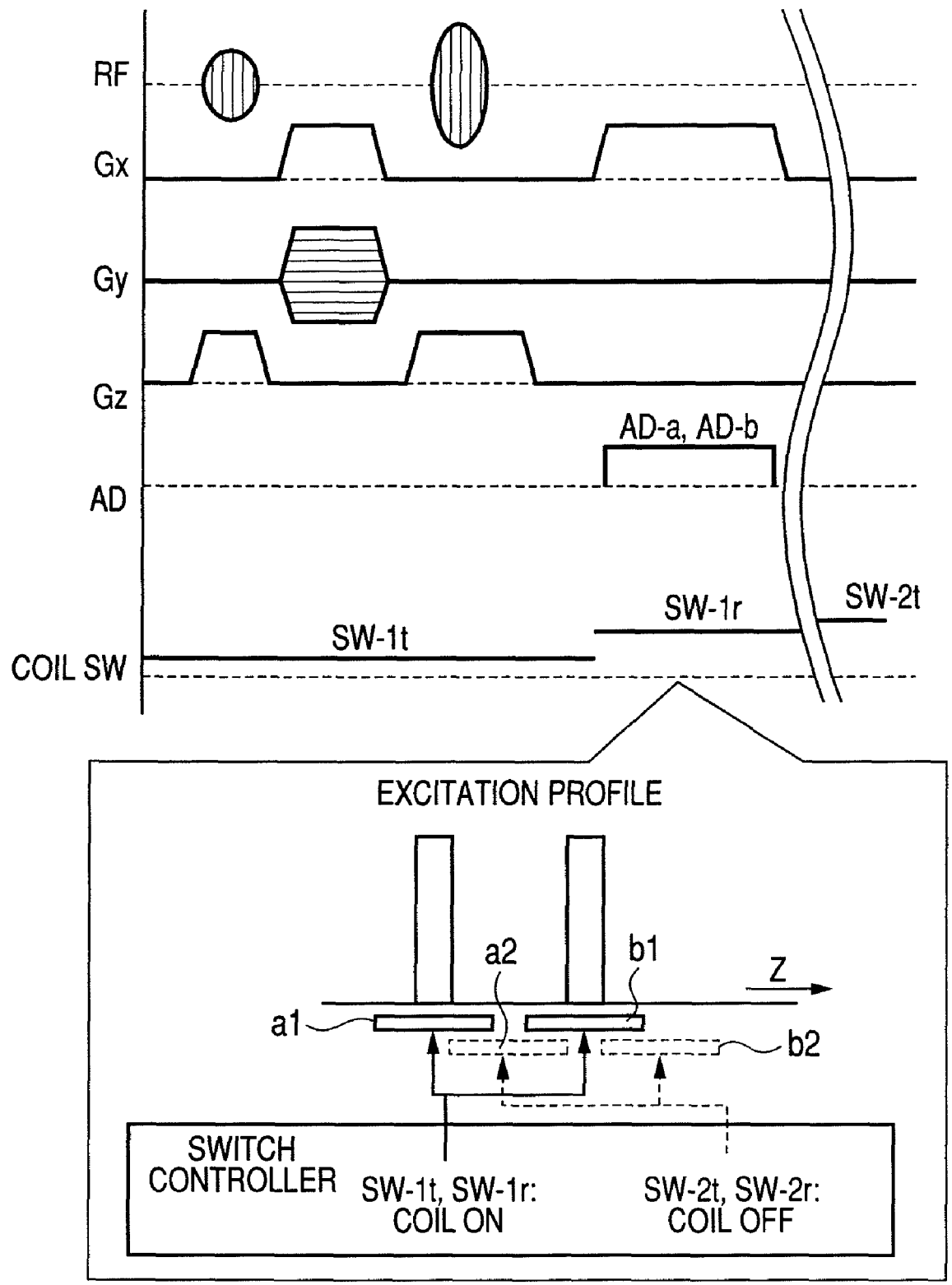
FIG. 11 is a diagram showing a measurement sequence using the RF coil system of the third embodiment.

In a measurement with such an RF coil system, for example, measurement is performed according to the measurement sequence shown in FIG. 11, in which case the number of phase encodes is reduced and the measurement time is shortened. In general, if the number of phase encodes is reduced, aliasing artifacts are generated, but these aliasing artifacts are removed using the difference in sensitivity maps. This method is known by the name of parallel receive, and is described in detail in JP-A No. 2002-153440. The number of coil divisions is not limited to 2, and may be further increased. Thereby, the measurement time can be theoretically shortened to 1/no. of coils. However, if the number of coil divisions increases, more receive systems will be required and the device will become complex. Specifically, if the number of coil divisions is k, the required number of receiving systems will be n×k, and the device construction will become complex.

According to this embodiment, in addition to the effect that the measurement time is 1/n according to the number n of receive systems in the embodiments mentioned above, the measurement time can be further shortened.

Seventh Embodiment

In the above embodiment, the case was described where a slice in a direction perpendicular to the arrangement direction of the RF coils was excited, but the axis of the excitation slice is not limited thereto, and can be changed. Next, as a seventh embodiment of the invention, a measurement will be described where the method of applying the slice gradient is changed. This embodiment can be applied when, of the aforementioned RF coil systems, multiple transmit RF coils are used. Examples of constructions where there are multiple transmit RF coils are shown in FIG. 2 of the first embodiment, FIG. 10 of the third embodiment, and FIG. 14 of the fifth embodiment. Here, for convenience, the RF coil system shown in FIG. 2 will be described as an example.

Figure 17:
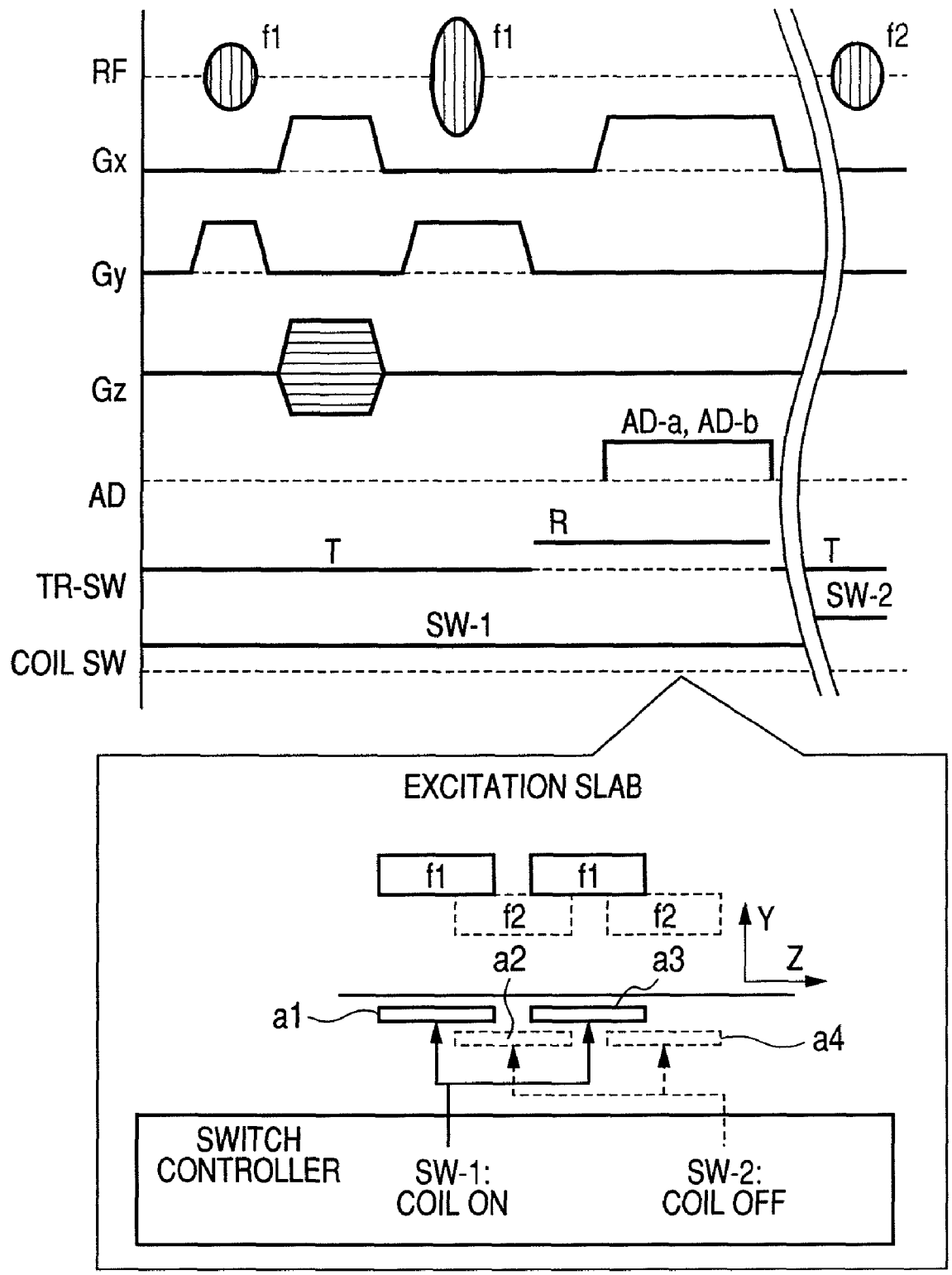
FIG. 17 is a diagram showing another embodiment of the measurement sequence using the RF coil system of the invention.

FIG. 17 shows a measurement sequence of the invention. The differences of this measurement sequence from the sequence shown in FIG. 6 are the slices and the application direction of the phase encode gradient, and the shape of the RF excitation pulse. In FIG. 6, the slice gradient was applied to the z axis and phase encoding was applied to the y axis, but in this embodiment, the slice gradient is applied to the y axis, and the phase encode gradient is applied to the z axis. In FIG. 6, the RF excitation pulse was a special shape for exciting two slices simultaneously (FIG. 7), but in this embodiment, an ordinary sinc function is used. By applying the slice gradient to the y axis, the excitation slice is the x-z plane, but since the active RF coil is spatially distant, only a slab-shaped region, which is the sensitivity region, is excited. The lower part of FIG. 17 is a schematic diagram of the excitation slab. This excitation slab is shifted for each transmission frequency such that the excitation regions do not overlap. Here, the coils a1, b1 are activated first, the region excited at a frequency fi is measured, then the coils a2, b2 are made active, the frequency is also changed to f2, and the excitation region is adjusted so that the excitation slabs do not overlap.

The sequence will now be described in detail.

First, the TR-SW is set to transmit T, the Coil SW is set to SW-1, and an RF excitation pulse is applied while applying the slice gradient Gy. In this process, as shown in the lower part of FIG. 17, the slice gradient Gy and RF excitation pulse are adjusted so that the excitation profiles for the coil a1, coil b1 are a horizontal plane. For this adjustment, an ordinary region selection sinc pulse, or a pulse which is a modification thereof, may be used. Here, the slice gradient Gy was constant during RF application, but the embodiment is not limited thereto. Next, the read-out gradient Gx is applied so that the magnetic resonance signals in the excitation region connect echoes. To acquire spatial information in the z direction, the phase encode gradient Gz is applied. Next, an RF inversion pulse is applied while applying the slice gradient Gy. As the RF inversion pulse, an ordinary region selection sinc pulse, or a pulse which is a modification thereof, may be used.

Next, the TR-SW is changed over to receive R, and data acquisitions AD-a, AD-b are performed for the data RF receive systems a, b by applying the read-out gradient Gx to connect the echoes of the magnetic resonance signals. Here, control is performed so that only the RF coils a1, b1 are active, and the RF coils, a2, b2 are inactive. Since the RF coils a1, b1 are sufficiently spatially separated, even if both are active, RF coupling is not generated.

Of course, since SW-2 is inactive, RF coupling with a2, b2 does not occur either. For this reason, the RF coils a1, b1 acquire signals independently. Specifically, the signals from two excitation slabs can be acquired simultaneously without any SN deterioration. The sequence from the RF excitation pulse to the data acquisitions AD-a, AD-b is repeated while varying the application amount of the phase encode gradient Gz, and data for a predetermined number of phase encodes, i.e., data for a 2-dimensional image, is obtained.

Next, the decoupling circuit SW is changed over to SW-2, the excitation frequency is also changed from f1 to f2, and the same loop is repeated to acquire a 3-dimensional image. Either the repeating loop which changes phase encode, or the repeating loop which changes the position of the excitation profile, may be performed first. In other words, with the same phase encoding, the Coil SW may be changed over from SW-1 to SW-2, the sequence shown in FIG. 17 executed and the phase encode changed, then the Coil SW changed over from SW-1 to SW-2 again, and the sequence shown in FIG. 17 executed. If the loop which changes the excitation slice position (this is assumed to be the inner loop) is executed first, it is not necessary to wait for relaxation of the nuclear magnetism in the excitation slab, so the measurement repetition time (TR) can be shortened and the measurement time can be shortened.

According to this embodiment, as in the first or third embodiments, signals can be acquired from all regions in half the measurement time without SN deterioration. Conversely, in the same measurement time, twice as many signals can be integrated, and the SN can be improved by $\sqrt{2}$ times. Since RF transmission is performed only near the active RF coil, the SAR can be reduced.

In this embodiment also, the sensitivity distortion correction described in the first-third embodiments (FIG. 12), change in the overlap of RF coils (FIG. 13), change in the number of coil sets or the number of RF coils constituting one RF coil set (FIG. 14), and the combined use of parallel receive (FIG. 16), may be practiced.

In this measurement sequence also, it will of course be understood that, in addition to an SE sequence, another measurement sequence such as the gradient echo method, echo planar method or fast SE method, may be used.

Eighth Embodiment

Figure 18:
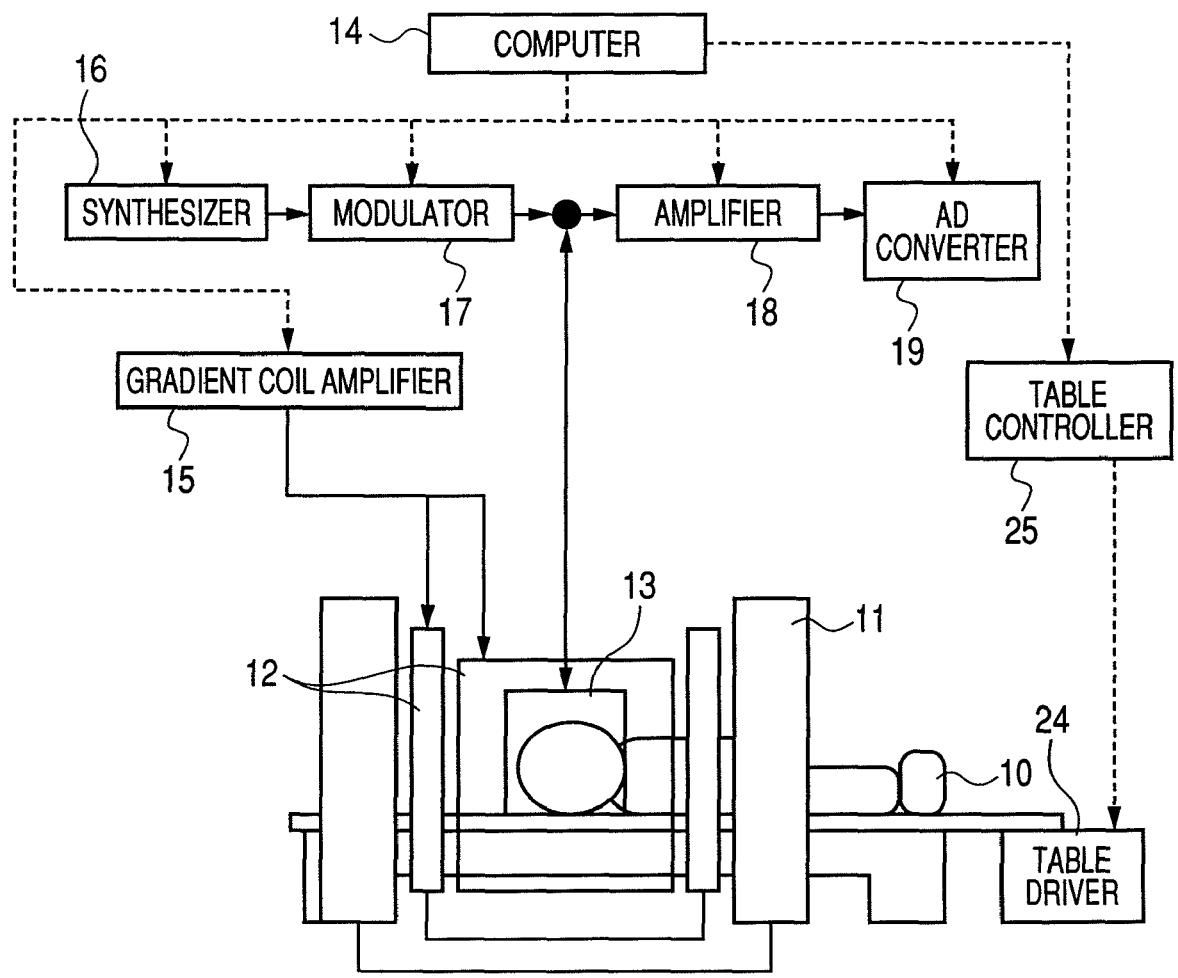
FIG. 18 is a diagram showing another example of the construction of the magnetic resonance system to which the invention is applied.

As an eighth embodiment of the invention, a measurement method accompanied by movement of the table will now be described. FIG. 18 shows an overall magnetic resonance system to which this embodiment is applied. In FIG. 18, the same elements as those in the magnetic resonance system shown in FIG. 1 are denoted by the same symbols, and their descriptions are omitted.

The difference of this magnetic resonance system from the magnetic resonance system of FIG. 1, is that a table controller 25 which controls the table in response to a control signal from the computer 14, and a table driver 26 which moves the table position in response to a control signal from the table controller 25, are added. The computer 14 calculates the movement amount of the table, and sends a table start/end and motion speed control signal to the table controller 25. The table controller 25 operates the table driver 26 according to the received control signal. In order to increase positioning precision, the device may be combined with a table position detector, and the motion amount fed back. As the table position detector, the table position encoder of an ordinary magnetic resonance system may be used.

The RF coil system of this embodiment may be any of the RF coil systems of the first-sixth embodiments described above, but the coil shape is preferably not a surface coil which moves together with the object, but a volume coil fixed to the device. Here, the case where the RF coil system shown in FIG. 2 is used, is described. The coil set is disposed so that the arrangement direction coincides with the motion direction of the table.

Next, the measurement method with the aforesaid magnetic resonance system will be described. FIG. 19 shows a typical example of a measurement sequence which implements this measurement method. This measurement sequence is based on the measurement sequence shown in FIG. 6, the difference being that control of the table position is added to the lowest part. First, the table is fixed in a table position and the Coil SW is set to SW-1, then a measurement sequence which changes over T-R from RF transmit during the echo measurement, is repeated while changing the decoupling circuit set by the Coil SW, and receive is performed by all the RF coils constituting the coil set. Either the repeating loop which changes phase encode, or the repeating loop which changes the position of the excitation profile, maybe performed first. After a series of measurements including measurement of both loops is complete, the table is moved from table position 0 to table position 1, fixed, and a series of measurements is again performed.

In this case, for an RF coil system where the arrangement direction of the multiple RF coils constituting the coil set is the same as the arrangement direction of the coil set, the amount by which the table moves in one movement, i.e., the interval between a table position 0 and table position 1, is made narrower than the distance between the RF coils. The lower part of FIG. 19 shows the situation where the object 10 is moved in the arrangement direction of the coils (z axis direction) relative to the RF coil systems a1, a2, b1, b2 fixed to the device. As shown in the diagram, the sensitivity of the RF coil systems a1, a2, b1, b2 is highest at the center of each RF coil, and decreases with increasing distance from the center. Therefore, in the obtained image, the signal intensity is reduced in the middle slices of the RF coils. In the measurement method of this embodiment, by repeating the measurement while shifting the position of the object 10 in the z axis direction with a narrower interval than the interval between coils, the excitation slice can always be held near the center of each RF coil. In this way, the effect of sensitivity distortion can be removed. This permits the same effect to be obtained as in the embodiment shown in FIG. 13, where the degree of overlap of the RF coils constituting the coil set is increased.

Here, the case was described where the table was moved between adjacent RF coils to compensate the signal intensity drop due to the low sensitivity between RF coils adjacent to the table, but in the magnetic resonance system provided with the table controller 25 and table driver 26, by repeating the measurement while moving the object, a measurement region larger than the measurement region covered by the RF coil set, can be measured. Further, by adjusting the interval d such that the result of dividing the interval L between RF coils by the interval d through which the table moves, L/d, is not an integer and such that the surplus is a suitable value, measurements can be performed at high speed while acquiring signals from multiple slices at an interval narrower than the interval L of the RF coils over a large region of the object. For example, in the lower part of FIG. 19, if the coil interval is 5 cm and the excitation slice thickness is 1 cm or less, and if the table motion interval is 4 cm, a wide region can be measured at high speed by equidistant slices. In general, if the total number of coils is nm, and d=L*nm/(nm+1), measurement can be performed at high speed and with equidistant slices.

In the above, the magnetic resonance system of the invention, and in particular, some embodiments of the RF coil system and the measurement method using them, were described. These embodiments of the measurement method may be applied not only to an ordinary imaging sequence based on the relaxation time of water molecules, but also to diffusion imaging which measures the intensity of molecular diffusion of molecules. Also in this case, in particular, if used for measurement of the chest and abdominal domain which have a large motion, it is particularly effective in combination with a fast measurement method, and the following prior art problems can be resolved. In the usual SE method, there is the problem that the image is disrupted by body motion between repeat phase encodes. As another method of measuring the chest and abdominal domain, another method referred to as line scan which places the excitation region on a line, has been proposed, but if there is a large motion, motion artifacts occur where the joins between excitation regions are not well matched. When measuring the ADC (apparent diffusion coefficient) using diffusion imaging, it is necessary to measure multiple images while varying the intensity of the diffusion gradient. Also in this case, if the measurement time is long, positional shifts occur due to motion, and a precise ADC cannot be measured. The method of the present invention, by measuring multiple slices simultaneously, can considerably shorten the measurement time, and it is therefore effective in mitigating the effect of motion.

Next, as an example of the application of the invention, spectroscopic imaging using the RF coil system of this invention will be described. Spectroscopic imaging is an imaging method where spatial information is assigned while separating chemical substances contained in the body in minute amounts by chemical shifts. Hence, since the SN is low, a long measurement time was required to obtain a sufficient SN. According to this embodiment, it is possible to shorten this long measurement time.

For convenience, the RF coil system of FIG. 1 of the embodiments will be taken as an example, but the RF coil systems shown in the other embodiments may also be used.

Figure 20:
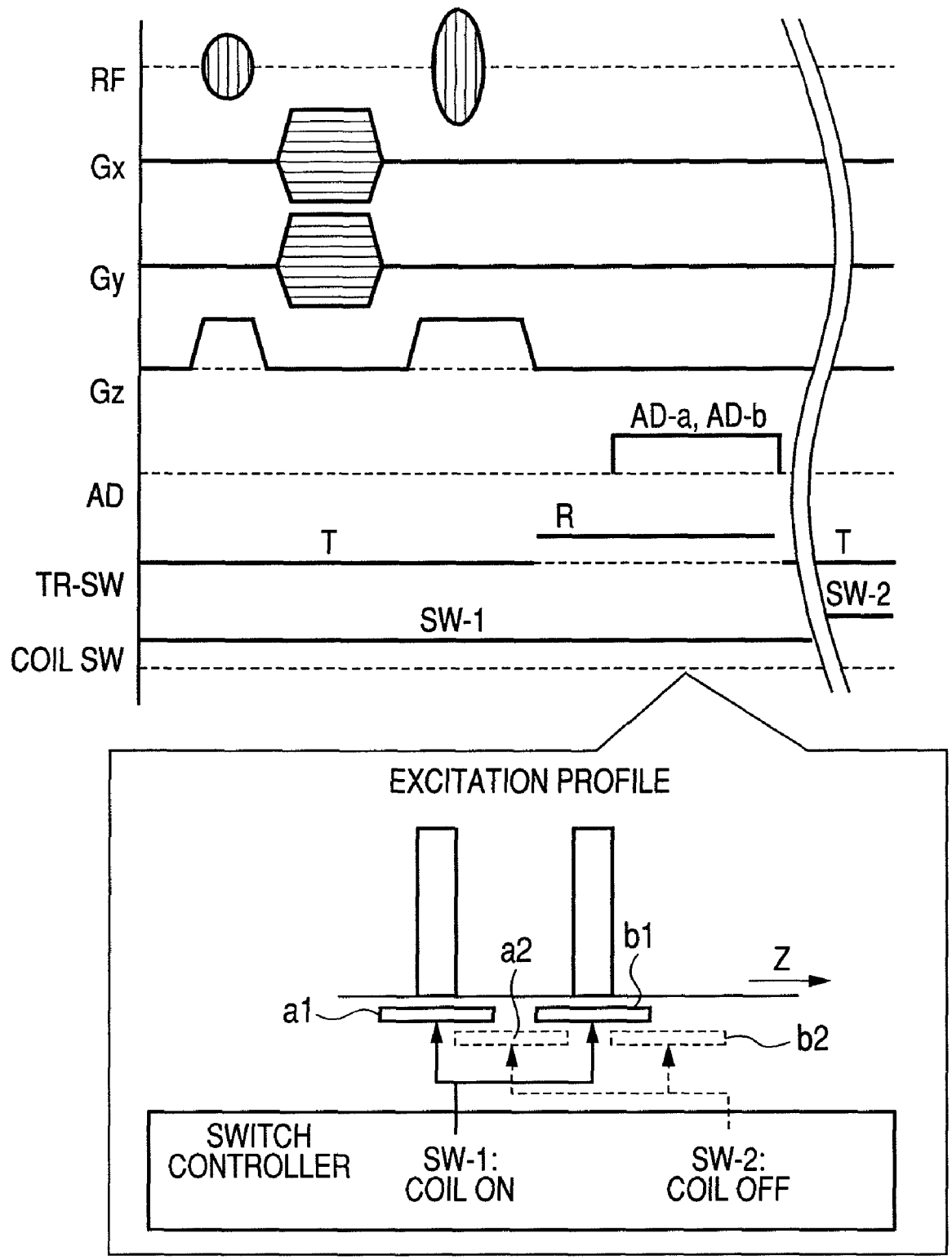
FIG. 20 is a diagram showing a measurement sequence for spectroscopic imaging using the RF coil system of the invention.

FIG. 20 shows a typical example of a spectroscopic imaging sequence using the RF coil system of the invention. The upper part of FIG. 20 is a sequence diagram wherein the horizontal axis is time, the vertical axis shows the RF field, gradient Gx, Gy, Gz, data acquisition AD, transmit/receive switch TR-SW and coil switch Coil SW, and the diagram shows respective timings and intensities. Here, spectroscopic imaging will be described taking the case of 2-dimensional phase encoding, which is generally used, as an example. In this sequence, for convenience, the axial direction of the RF coil system of FIG. 1 will be taken as the z axis.

First, the TR-SW is set to transmit T, the Coil SW is set to SW-1, and an RF excitation pulse is applied while applying the slice gradient Gz. At this time, as shown in the lower part of FIG. 20, Gz and the RF excitation pulse are adjusted so that the excitation profile is a plane perpendicular to the coils a1, coil b1. The adjustment method is identical to that of the first embodiment. Next, to acquire spatial information in the x direction and y direction, a phase encode gradient is applied while varying the application amount of Gx and Gy, respectively. Next, an RF inversion pulse is applied while applying Gz. On this occasion also, the intensity and the phase of Gz and the RF excitation pulse are adjusted so that the magnetic resonance signal excited by the excitation pulse is inverted.

Next, the TR-SW is changed over to receive R, and the data RF receive systems a, b perform data acquisitions AD-a, AD-b. Here, control is performed so that only the RF coils a1, b1 are active, and the RF coils a2, b2 are inactive. Since the RF coils a1, b1 are spatially separated, even if both are active, RF coupling does not occur. Of course, since SW-2 is inactive, RF coupling with a2, b2 does not occur either. For this reason, the RF coils a1, b1 acquire signals independently. In other words, signals can be acquired simultaneously from two excitation slices without any SN deterioration.

In the following loop, the Coil SW is changed over to SW-2, and this series of sequences is repeated. The measurement is repeated while varying the phase encoding amount, and a 3-dimensional (chemical shifts, x, y) spectroscopic image is thereby acquired. The measurement is again repeated while shifting the position of the excitation slice in the z axis direction, and the spectroscopic image of a 4-dimensional region (chemical shift+3-dimensional space) is thereby acquired. By performing repeated measurements in this way, all continuous regions are measured.

According to the method of this invention, two excitation slices can be measured simultaneously, so signals can be acquired from all regions in half the measurement time with no SN deterioration. Conversely, in the same measurement time, twice as many signals can be integrated, so the SN can be improved by $\sqrt{2}$ times. In this method, by using an RF coil system which comprises multiple RF also for the transmit system, RF transmission is performed only near the active RF coils, so this is effective in decreasing the SAR. Although this effect depends also on the overlap condition of the RF coils, about half the effect can be expected in the case where there is no overlap. From the viewpoint of protecting the object, this SAR suppression becomes more important as the static magnetic field intensity increases.

In this example, the case was described where two receive units were used, but as described in the fifth embodiment, effects such as shortening of measurement time can be enhanced by increasing the number of systems. If the number of receive units is n, the number of excitation slices which can be acquired simultaneously is n, and the measurement time is 1/n. For a fixed measurement time, the SN can also be improved by $\sqrt{n}$ times. Also, if the number of the coils constituting the coil set used for transmission is m, there is also a maximum SAR suppression effect of 1/m.

This sequence has been described for typical 2-dimensional phase encoding, but it will be understood that it can be applied to other measurement sequences, such as echo planar spectroscopic imaging. It will be further understood that it can be applied to diffusion spectroscopic imaging where it is combined with diffusion imaging which measures the molecular diffusion intensity of molecules.

According to the invention, there is provided a magnetic resonance system and method which can measure continuous regions with a high SN without extending the measurement time. By applying the invention to, for example, the measurement of parts which have motion, an image where motion artifacts are suppressed can be obtained.

Since there is no SN deterioration, the invention is very effective when applied to spectroscopic imaging where, since signals are acquired for each chemical species, high signal intensities cannot be ensured.

What is claimed is:

1. A magnetic resonance system, comprising a static magnetic field generation system, an RF transmitter which transmits a nuclear magnetic signal to an object placed in the static magnetic field, an RF receiver which receives a nuclear magnetic resonance signal from said object, and a signal processing system which generates an image and/or spectrum of said object using the nuclear magnetic resonance signal received by said RF receiver, wherein:
    said RF receiver comprises multiple receive units and at least one array of multiple coils which overlap without forming any gaps therebetween, and the multiple coils are grouped into multiple coil sets connected to each of said multiple receive units, and wherein:
    each coil set comprises multiple RF coils and is disposed in a position which does not spatially interfere with at least one RF coil of the respectively adjacent coil sets of said multiple RF coils, and further comprises a switch controller which controls ON-OFF of said RF coils to sequentially switch one of the multiple RF coils forming each coil set to ON, a coil switch which selectively connects one of said multiple RF coils to said receive unit, and a coil controller which controls said switch controller and said coil switch.

2. The magnetic resonance system according to claim 1, wherein:
    said RF transmitter comprises at least one RF transmit unit; and
    said RF coils of said multiple coil sets of said RF receiver are switchable to also function as transmitting coils of said RF transmitter, and are provided with a transmit/receive switches which switch said RF coils between the receive unit and the transmit unit.

3. The magnetic resonance system according to claim 2, wherein the multiple coil sets are connected to the same transmit unit.

4. The magnetic resonance system according to claim 1, wherein:
said RF transmitter comprises at least one transmit unit and multiple coil sets, and wherein:
each coil set comprises multiple RF coils and is disposed in a position which does not interfere with at least one RF coil of the adjacent coil sets, and further comprises a switch controller which controls ON-OFF of said RF coils to sequentially switch one of the multiple RF coils forming each coil set, a coil switch which selectively switches each of said multiple RF coils between the transmit unit and the receive unit, and a coil controller which controls said switch controller and said coil switch.

5. The magnetic resonance system according to claim 4, wherein the multiple coil sets are connected to the same transmit unit.

6. The magnetic resonance system according to claim 1, wherein said RF transmitter comprises an RF coil covering sensitivity map regions of two or more coil sets.

7. The magnetic resonance system according to claim 6, wherein part of the sensitivity map regions of multiple RF coils constituting said coil set mutually overlap.

8. The magnetic resonance system according to claim 1, wherein said multiple RF coils are arranged in an uniaxial direction.

9. The magnetic resonance system according to claim 1, wherein said signal processing system is provided with a correction method which corrects a sensitivity distortion of the nuclear magnetic resonance signal received by the multiple RF coils.

10. The magnetic resonance system according to claim 1, provided with a moving device which moves said object in a static magnetic field, and wherein:
said multiple coil sets are disposed in the motion direction of the object moved by said moving device.

11. A magnetic resonance measurement method comprising which transmitting an RF field to an object placed in a static magnetic field, receiving a nuclear magnetic resonance signal from said object, and generating an image and/or a spectrum of the object using said nuclear magnetic resonance signal received by an RF receiver having multiple receive units and at least one array of multiple coils which overlap without forming any gaps therebetween, and the multiple coils are grouped into multiple coil sets connected to each of said multiple receive units, and each coil set comprises multiple RF coils, said method repeatedly performing:
a step of transmitting an RF field to the object; and
a step of switching one RF coil of each multiple coil set to receive a nuclear magnetic resonance signal, and sequentially changing over the RF coil of each coil set switched to receive the nuclear resonance signal, and generating an image and/or a spectrum of the object using the nuclear magnetic resonance signal sequentially received by the multiple RF coils.

12. The magnetic resonance measurement method according to claim 11, wherein said method further comprises a step of switching over the RF coil from transmitting to receiving after transmission of the RF field.

13. The magnetic resonance measurement method according to claim 11, wherein said coil sets are arranged in a uniaxial direction; and
the step of transmitting said RF field includes generation of the RF field having an excitation profile which excites multiple cross-sections perpendicular to the array direction of said coil sets.

14. The magnetic resonance measurement method according to claim 13, wherein said RF field is a pulse waveform obtained by performing an inverse Fourier transform of a desired excitation profile, or a DANTE pulse.

15. The magnetic resonance measurement method according to claim 13, comprising a step which, when the step of transmitting said RF field and the step of receiving said nuclear magnetic resonance signals are repeated, during moving of said object in the direction of said coil sets.

16. The magnetic resonance measurement method according to claim 15, wherein, in the step of moving of said object, said object is moved by a width shorter than the interval of the coil sets.

17. The magnetic resonance measurement method according to claim 11, wherein said coil sets are arranged in a uniaxial direction, and the step of transmitting said RF field generates an RF field having an excitation profile which excites multiple cross-sections parallel to the array direction of said coil sets.

18. The magnetic resonance measurement method according to claim 17, wherein the pulse shape of said RF field is a sinc function.

19. The magnetic resonance measurement method according to claim 11, comprising a step which generates a spectroscopic image using a nuclear magnetic resonance signal received by multiple RF coils of each coil set.

* * * * *